US012652061B2

(12) United States Patent
Kumano et al.

(10) Patent No.: US 12,652,061 B2
(45) Date of Patent: Jun. 9, 2026

(54) MEMORY SYSTEM THAT PERFORMS ERROR CORRECTION USING METRIC ARRAY AND METHOD OF CONTROLLING THE SAME

(71) Applicant: Kioxia Corporation, Tokyo (JP)

(72) Inventors: Yuta Kumano, Kawasaki Kanagawa (JP); Hironori Uchikawa, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/821,531

(22) Filed: Aug. 30, 2024

(65) Prior Publication Data

US 2025/0096816 A1    Mar. 20, 2025

(30) Foreign Application Priority Data

Sep. 15, 2023    (JP) ................................. 2023-150337

(51) Int. Cl.
*H03M 13/00*       (2006.01)
*H03M 13/11*       (2006.01)

(52) U.S. Cl.
CPC .... *H03M 13/1108* (2013.01); *H03M 13/1111* (2013.01); *H03M 13/611* (2013.01)

(58) Field of Classification Search
CPC .......... H03M 13/1108; H03M 13/1111; H03M 13/611; H03M 13/45
See application file for complete search history.

(56) References Cited

U.S. PATENT DOCUMENTS

| | | | |
|---|---|---|---|
| 6,879,267 B2 * | 4/2005 | Yamazaki ......... | H03M 13/3961 |
| | | | 375/330 |
| 7,555,070 B1 * | 6/2009 | Ulriksson ......... | H03M 13/6331 |
| | | | 714/795 |
| 8,661,324 B2 * | 2/2014 | Yang .................. | H03M 13/1111 |
| | | | 714/763 |
| 9,621,188 B2 * | 4/2017 | Hof ..................... | H03M 13/1108 |
| 10,778,258 B2 * | 9/2020 | Watanabe ......... | H03M 13/2963 |
| 10,903,861 B2 * | 1/2021 | Sandell .............. | H03M 13/458 |
| 10,963,338 B1 * | 3/2021 | Steiner ............. | G11C 29/50004 |
| 11,411,582 B1 * | 8/2022 | Zhang ............... | H03M 13/3707 |

(Continued)

OTHER PUBLICATIONS

Wang, X. et al., "Bit-Level Soft-Decision Decoding of Double and Triple-Parity Reed-Solomon Codes Through Binary Hamming Code Constraints" IEEE Communications Letters, vol. 19, No. 2, pp. 135-138, Feb. 2015. DOI: 10.1109/LCOMM.2014.2385052.

(Continued)

*Primary Examiner* — Esaw T Abraham
(74) *Attorney, Agent, or Firm* — Kim & Stewart LLP

(57)            ABSTRACT

A memory system includes a non-volatile memory and a memory controller. The memory controller is configured to read data from the non-volatile memory, obtain a plurality of decoded words based on a syndrome calculated from a soft decision input data based on the read data, calculate a plurality of metrics for the plurality of decoded words, generate a metric array using the calculated metrics. Further, the memory controller is configured to, based on a relationship of each value of the metric array with a smallest one of the metrics and a second smallest one of the metrics, obtain a soft decision output data corresponding to the soft decision input data.

19 Claims, 27 Drawing Sheets

(56) References Cited

U.S. PATENT DOCUMENTS

| | | |
|---|---|---|
| 2015/0039965 A1 | 2/2015 | Fonseka et al. |
| 2016/0352362 A1 | 12/2016 | Fonseka et al. |
| 2019/0199690 A1 | 6/2019 | Klein |

OTHER PUBLICATIONS

Martin, P. A. et al., "Soft-Input Soft-Output List-Based Decoding Algorithm" IEEE Transactions on Communications, vol. 52, No. 2, pp. 252-262, Feb. 2004. DOI: 10.1109/isit.2002.1023611.
Ashikhmin, A. et al., "Simple MAP Decoding of First-Order Reed-Muller and Hamming Codes" IEEE Transactions on Information Theory, vol. 50, No. 8, pp. 1812-1818, Aug. 2004. DOI: 10.1109/TIT.2004.831835.

* cited by examiner

FIG. 3
SOFT DECISION INPUT VALUE $L^{(in)}$ =
| 1 | 2 | 3 | 4 | −5 |
|---|---|---|---|----|
$\Rightarrow$
HARD DECISION VALUE =
| 0 | 0 | 0 | 0 | 1 |
|---|---|---|---|---|
TWO-DIMENSIONAL METRIC ARRAY
METRIC
DECODED WORD
$D^{(1)}$ =
| 0 | 0 | 0 | 0 | <u>0</u> |
|---|---|---|---|---|
$M(D^{(1)}) = |-5| = 5$
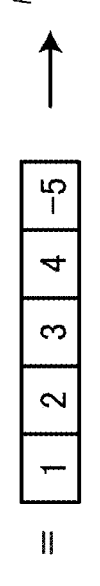
| WITH CORRECTION | | | | | <u>5</u> |
|---|---|---|---|---|---|
| WITHOUT CORRECTION | 5 | 5 | 5 | 5 | |
$D^{(2)}$ =
| 0 | 0 | 1 | 1 | 1 |
|---|---|---|---|---|
$M(D^{(2)}) = 3 + 4 = 7$
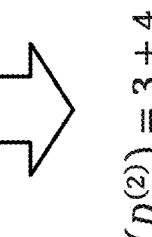
| WITH CORRECTION | | | <u>7</u> | <u>7</u> | 5 |
|---|---|---|---|---|---|
| WITHOUT CORRECTION | 5 | 5 | 5 | 5 | <u>7</u> |
$D^{(3)}$ =
| <u>1</u> | 1 | 0 | 0 | 1 |
|---|---|---|---|---|
$M(D^{(3)}) = 1 + 2 = 3$
| WITH CORRECTION | <u>3</u> | <u>3</u> | 7 | <u>3</u> | 5 |
|---|---|---|---|---|---|
| WITHOUT CORRECTION | 5 | 5 | 5 | <u>3</u> | <u>3</u> |

FIG. 7

*SOFT DECISION INPUT VALUE $L^{(in)}$*

$= \boxed{1 \mid 2 \mid 3 \mid 4 \mid -5}$ $\Rightarrow$

*HARD DECISION VALUE* $= \boxed{0 \mid 0 \mid 0 \mid 0 \mid 1}$

METRIC $M(D^{(1)}) = |-5| = 5$ $\Rightarrow$ $M(D^{(2)}) = 3 + 4 = 7$ $\Rightarrow$ $M(D^{(3)}) = 1 + 2 = 3$

DECODED WORD $D^{(1)} = \boxed{0 \mid 0 \mid 0 \mid 0 \mid 0}$ $D^{(2)} = \boxed{0 \mid 0 \mid 1 \mid 1 \mid 1}$ $D^{(3)} = \boxed{1 \mid 1 \mid 0 \mid 0 \mid 1}$ ONE-DIMENSIONAL METRIC ARRAY, min1, mi2

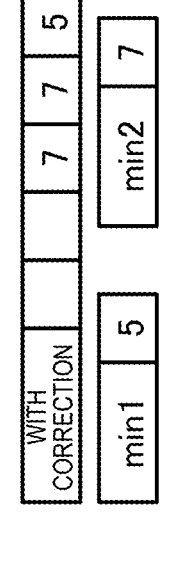

WITH CORRECTION $\boxed{\phantom{0} \mid \phantom{0} \mid \phantom{0} \mid \phantom{0} \mid 5}$ min1 $\boxed{5}$    min2 $\boxed{\phantom{0}}$ WITH CORRECTION $\boxed{\phantom{0} \mid \phantom{0} \mid 7 \mid 7 \mid 5}$ min1 $\boxed{5}$    min2 $\boxed{7}$ WITH CORRECTION $\boxed{3 \mid 3 \mid 7 \mid 7 \mid 5}$ min1 $\boxed{3}$    min2 $\boxed{5}$

FIG. 8

ONE-DIMENSIONAL METRIC ARRAY, min1, mi2

| WITH CORRECTION | 3 | 3 | 7 | 7 | 5 |
|---|---|---|---|---|---|

| min1 | 3 |
|---|---|

| min2 | 5 |
|---|---|

SOFT DECISION OUTPUT VALUE $L^{(out)}$ =

| -2 | -2 | 4 | 4 | -2 |
|---|---|---|---|---|

| NAME | NOTATION | NUMBER OF ELEMENTS | CALCULATION FORMULA |
|---|---|---|---|
| FIRST-DIMENSIONAL XOR DATA | $x = (x_0, x_1, \ldots, x_{m-1})$ | $m$ | $x_j = \bigoplus_{i=0}^{n-1} h(L_{i,j})$ |
| FIRST-DIMENSIONAL min1 DATA | $y = (y_0, y_1, \ldots, y_{m-1})$ | $m$ | $y_j = \min_i |L_{i,j}|$ |
| FIRST-DIMENSIONAL min2 DATA | $z = (z_0, z_1, \ldots, z_{m-1})$ | $m$ | $z_j = \text{smin}_i |L_{i,j}|$ |

*FIG. 18*

| NAME | NOTATION | NUMBER OF ELEMENTS | CALCULATION FORMULA |
|---|---|---|---|
| SECOND-DIMENSIONAL XOR DATA | $x' = (x'_0, x'_1, \ldots, x'_{L-1})$ | $L$ | $x'_l = \oplus h(L_{i,j})$ <br> $i + j \equiv l \pmod{2^m - 1}$ |
| SECOND-DIMENSIONAL min1 DATA | $y' = (y'_0, y'_1, \ldots, y'_{L-1})$ | $L$ | $y'_l = min\,|L_{i,j}|$ <br> $i + j \equiv l \pmod{2^m - 1}$ |
| SECOND-DIMENSIONAL min2 DATA | $z' = (z'_0, z'_1, \ldots, z'_{L-1})$ | $L$ | $z'_l = smin\,|L_{i,j}|$ <br> $i + j \equiv l \pmod{2^m - 1}$ |

FIG. 20

| NAME | NOTATION | NUMBER OF ELEMENTS |
|---|---|---|
| CHANNEL LLR DATA | $L_{i,j}^{(c)}$ | $n \times m$ |
| LLR DATA 1 | $L_{i,j}^{(1)}$ | $n \times m$ |
| FIRST-DIMENSIONAL XOR DATA | $x_j$ | $m$ |
| FIRST-DIMENSIONAL min1 DATA | $y_j$ | $m$ |
| FIRST-DIMENSIONAL min2 DATA | $z_j$ | $m$ |
| FIRST-DIMENSIONAL EXTRINSIC LLR DATA | $L^{(e1)}$ | $n \times m$ |
| LLR DATA 2 | $L^{(2)}$ | $n \times m$ |
| SECOND-DIMENSIONAL XOR DATA | $x'_l$ | $L$ |
| SECOND-DIMENSIONAL min1 DATA | $y'_l$ | $L$ |
| SECOND-DIMENSIONAL min2 DATA | $z'_l$ | $L$ |
| HAMMING CODE INPUT LLR DATA | $L_{r,l}^{(ih)}$ | $L$ |
| HAMMING CODE EXTRINSIC LLR DATA | $L_k^{(eh)}$ | $L$ |
| SECOND-DIMENSIONAL EXTRINSIC LLR DATA | $L_{i,j}^{(e2)}$ | $n \times m$ |
| A POSTERIORI LLR DATA | $L_{i,j}^{(a)}$ | $n \times m$ |

FIG. 22

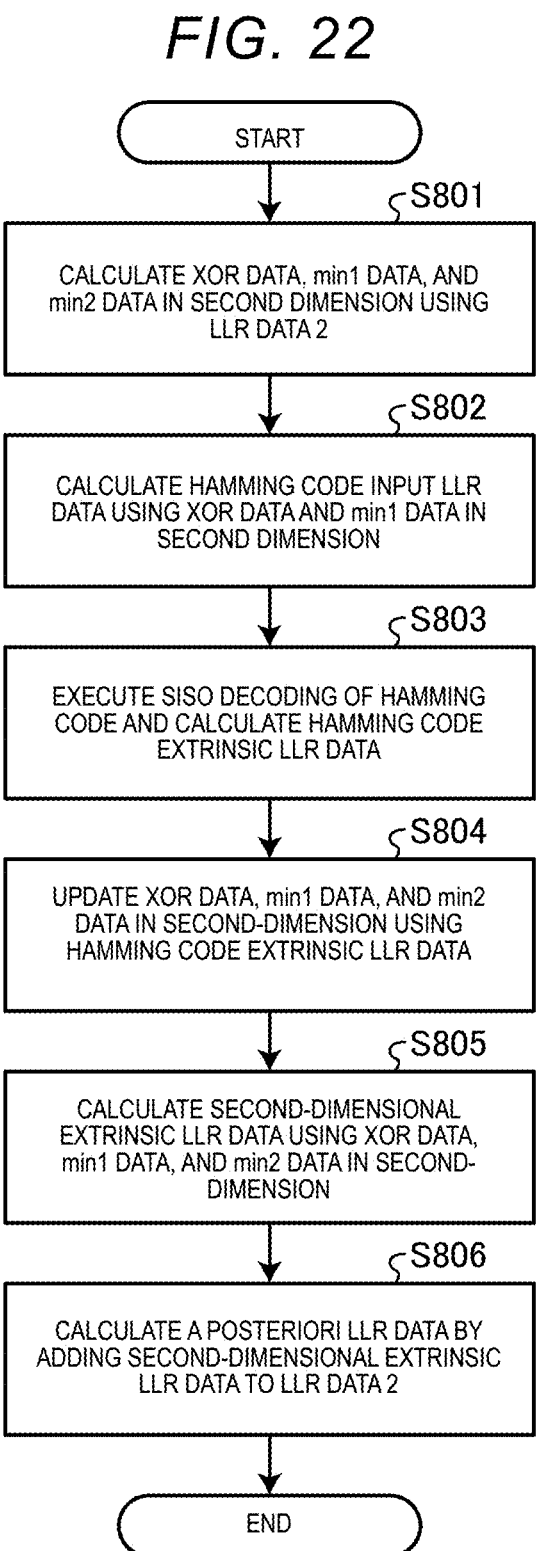

START

S801

CALCULATE XOR DATA, min1 DATA, AND min2 DATA IN SECOND DIMENSION USING LLR DATA 2

S802

CALCULATE HAMMING CODE INPUT LLR DATA USING XOR DATA AND min1 DATA IN SECOND DIMENSION

S803

EXECUTE SISO DECODING OF HAMMING CODE AND CALCULATE HAMMING CODE EXTRINSIC LLR DATA

S804

UPDATE XOR DATA, min1 DATA, AND min2 DATA IN SECOND-DIMENSION USING HAMMING CODE EXTRINSIC LLR DATA

S805

CALCULATE SECOND-DIMENSIONAL EXTRINSIC LLR DATA USING XOR DATA, min1 DATA, AND min2 DATA IN SECOND-DIMENSION

S806

CALCULATE A POSTERIORI LLR DATA BY ADDING SECOND-DIMENSIONAL EXTRINSIC LLR DATA TO LLR DATA 2

END

FIG. 25

| NAME | NOTATION | NUMBER OF ELEMENTS |
|---|---|---|
| LLR DATA 1 | $L^{(1)}_{r,i,j}$ | $N \times f \times m$ |
| DECODED WORD DATA | $D_{r,i,j}$ | $N \times n \times m$ |
| FIRST-DIMENSIONAL XOR DATA | $x_{r,j}$ | $K \times m$ |
| FIRST-DIMENSIONAL min1 DATA | $y_{r,j}$ | $K \times m$ |
| FIRST-DIMENSIONAL min2 DATA | $z_{r,j}$ | $K \times m$ |
| FIRST-DIMENSIONAL EXTRINSIC LLR DATA | $L^{(e1)}_{r,i,j}$ | $N \times f \times m$ |
| LLR DATA 2 | $L^{(2)}_{r,i,j}$ | $N \times f \times m$ |
| SECOND-DIMENSIONAL XOR DATA | $x'_{r,l}$ | $K \times L$ |
| SECOND-DIMENSIONAL min1 DATA | $y'_{r,l}$ | $K \times L$ |
| SECOND-DIMENSIONAL min2 DATA | $z'_{r,l}$ | $K \times L$ |
| HAMMING CODE INPUT LLR DATA | $L^{(he)}_{r,i,l}$ | $K \times L$ |
| SECOND-DIMENSIONAL EXTRINSIC LLR DATA | $L^{(e2)}_{r,i,j}$ | $N \times f \times m$ |
| LLR DATA 3 | $L^{(3)}_{r,i,j}$ | $N \times f \times m$ |

FIG. 29

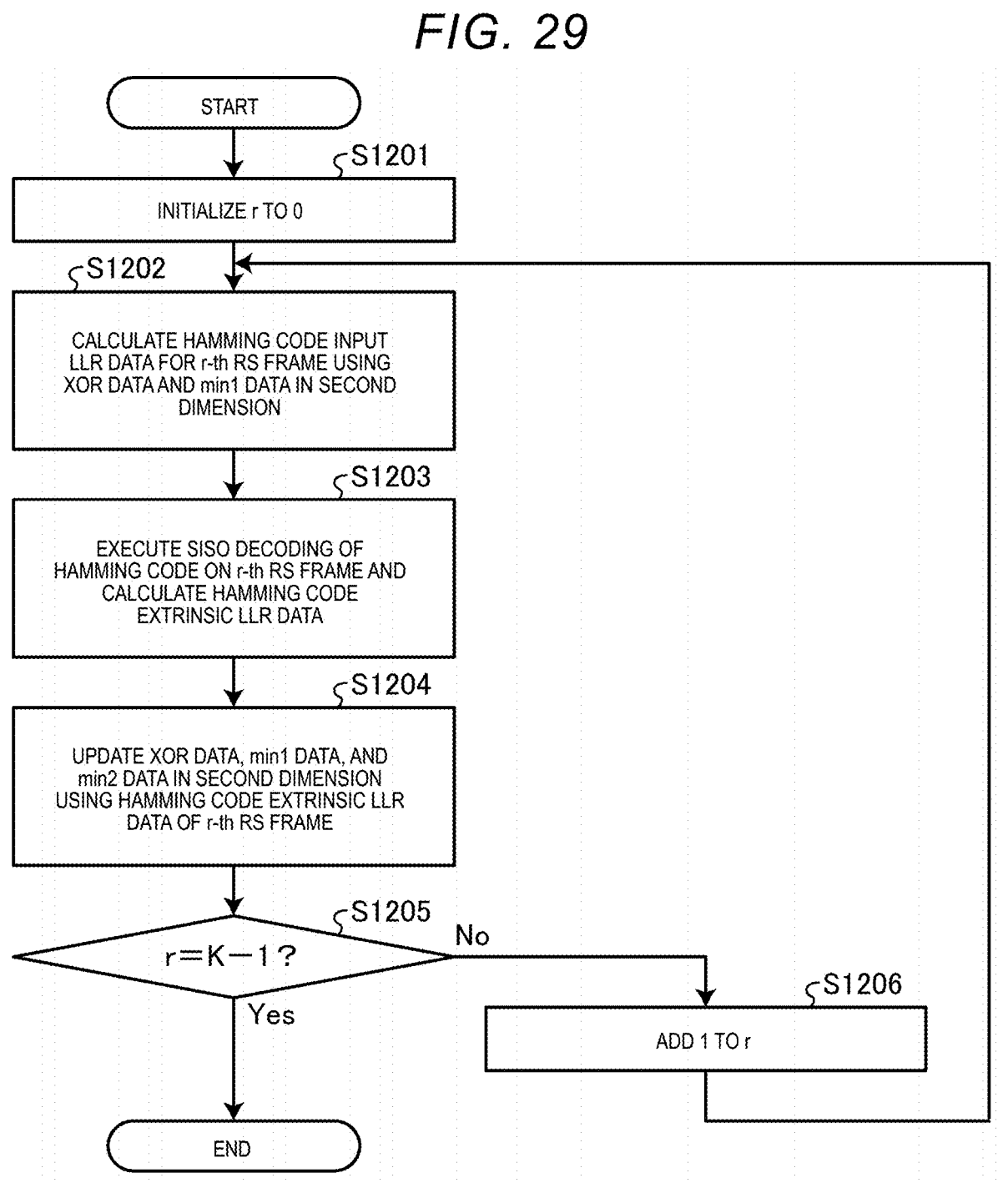

```
START
```

S1201

INITIALIZE r TO 0

S1202

CALCULATE HAMMING CODE INPUT
LLR DATA FOR r-th RS FRAME USING
XOR DATA AND min1 DATA IN SECOND
DIMENSION

S1203

EXECUTE SISO DECODING OF
HAMMING CODE ON r-th RS FRAME AND
CALCULATE HAMMING CODE
EXTRINSIC LLR DATA

S1204

UPDATE XOR DATA, min1 DATA, AND
min2 DATA IN SECOND DIMENSION
USING HAMMING CODE EXTRINSIC LLR
DATA OF r-th RS FRAME

S1205

$r = K - 1$ ?

No

S1206

ADD 1 TO r

Yes

```
END
```

MEMORY SYSTEM THAT PERFORMS ERROR CORRECTION USING METRIC ARRAY AND METHOD OF CONTROLLING THE SAME

CROSS-REFERENCE TO RELATED APPLICATION(S)

This application is based upon and claims the benefit of priority from Japanese Patent Application No. 2023-150337, filed Sep. 15, 2023, the entire contents of which are incorporated herein by reference.

FIELD

Embodiments described herein relate generally to a memory system and a control method.

BACKGROUND

In a memory system, error-correction encoded data is generally stored in order to protect stored data. For that reason, when reading the data stored in the memory system, the error-correction encoded data is decoded.

BRIEF DESCRIPTION OF THE DRAWINGS

FIG. 3 is a diagram showing an example of a flow of decoding processing according to a comparative example.

FIG. 7 is a diagram showing an example of the update processing by the memory system according to the first embodiment.

FIG. 8 is a diagram showing an example of the calculating processing by the memory system according to the first embodiment.

FIG. 18 is a diagram summarizing notations, elements, and calculation formula of data.

FIG. 20 is a diagram summarizing names, notations, and elements of data.

FIG. 22 is a flowchart of second-dimensional processing.

FIG. 25 is a diagram summarizing names, notations, and elements of data.

FIG. 29 is a flowchart of RS second-dimensional processing.

DETAILED DESCRIPTION

Embodiments provide a memory system and a control method capable thereof for reducing the amount of calculation for error-correction (decoding).

In general, according to an embodiment, a memory system includes a non-volatile memory and a memory controller. The memory controller is configured to: encode data to be written into the non-volatile memory using an error-correction code that includes a Hamming code; obtain a hard-read value of data read from the non-volatile memory using a read voltage; obtain a plurality of soft-read values of data read from the non-volatile memory using a plurality of read voltages; based on the hard-read value and the soft-read values, obtain a soft decision input data, each value of which indicates a likelihood that a corresponding bit of the read data is either 0 or 1; obtain a hard decision data of the soft decision input data; obtain a syndrome using the hard decision data and a parity check matrix of the error-correction code; decode the hard decision data using a predetermined decoding method to obtain decoded words that are different from each other; obtain a plurality of metrics each of which indicates a distance between one of the decoded words and the soft decision input data; generate a metric array using the obtained metrics; and based on a relationship of each value of the metric array with a smallest one of the metrics and a second smallest one of the metrics, obtain a soft decision output data corresponding to the soft decision input data, as a decoding result of the read data.

The memory system according to embodiments will be described in detail with reference to the accompanying drawings. The present disclosure is not limited to the following embodiments.

First Embodiment

Figure 1:
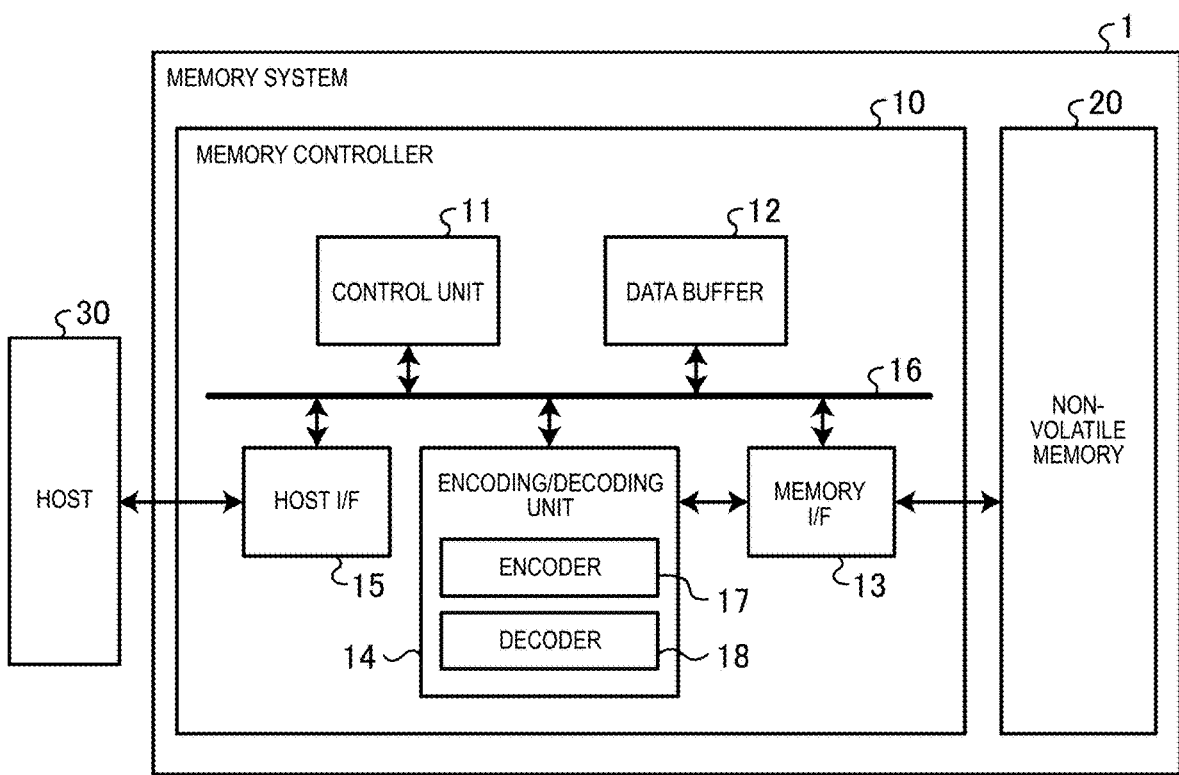
FIG. 1 is a block diagram of a memory system according to a first embodiment.

FIG. 1 is a block diagram showing a schematic configuration example of a memory system according to a first embodiment. As shown in FIG. 1, a memory system 1 includes a memory controller 10 and a non-volatile memory 20. The memory system 1 can be connected to a host 30, and FIG. 1 shows a state in which the memory system 1 is connected to the host 30. The host 30 may be, for example, an electronic device such as a personal computer or a mobile terminal.

The non-volatile memory 20 is a non-volatile memory that stores data in a non-volatile way, and is, for example, a NAND memory. In the following description, a case where a NAND memory is used as the non-volatile memory 20 will be described; however, as the non-volatile memory 20, it is also possible to use a storage device other than the NAND memory such as a three-dimensional structure flash memory, resistance random access memory (ReRAM), and ferroelectric random access memory (FeRAM). Further, the non-volatile memory 20 is not necessarily a semiconductor memory, and the present embodiment may be applied to various storage media other than the semiconductor memory.

The memory system 1 may be a memory card or the like in which the memory controller 10 and the non-volatile memory 20 are configured as one package, or may be a solid state drive (SSD) or the like.

The memory controller 10 controls writing to the non-volatile memory 20 according to a write request from the host 30. Further, the memory controller 10 controls reading from the non-volatile memory 20 according to a read request from the host 30. The memory controller 10 includes a host I/F (host interface) 15, a memory I/F (memory interface) 13, a control unit 11, an encoding/decoding unit (codec) 14, and a data buffer 12. The host I/F 15, the memory I/F 13, the control unit 11, the encoding/decoding unit 14, and the data buffer 12 are connected to each other by an internal bus 16.

The host I/F 15 performs processing according to the interface standard with the host 30, and outputs a command received from the host 30, user data to be written, and the like to the internal bus 16. Further, the host I/F 15 transmits the user data read from the non-volatile memory 20 and decoded, a response from the control unit 11, and the like to the host 30.

The memory I/F 13 performs a write operation to the non-volatile memory 20 based on an instruction of the control unit 11. Further, the memory I/F 13 performs a read operation from the non-volatile memory 20 based on an instruction of the control unit 11.

The control unit 11 comprehensively controls each component of the memory system 1. When the control unit 11 receives a command from the host 30 via the host I/F 15, the control unit 11 performs control according to the command. For example, the control unit 11 instructs the memory I/F 13 to write the user data and a parity to the non-volatile memory 20 according to the command from the host 30. Further, the control unit 11 instructs the memory I/F 13 to read the user data and the parity from the non-volatile memory 20 according to the command from the host 30.

When the control unit 11 receives a user data write request from the host 30, the control unit 11 stores the user data in the data buffer 12 and determines a storage area (memory area) of the user data in the non-volatile memory 20. That is, the control unit 11 manages the write destination of the user data. The correspondence between the logical address of the user data received from the host 30 and the physical address indicating the storage area on the non-volatile memory 20 in which the user data is stored is stored as an address conversion table.

When the control unit 11 receives a read request from the host 30, the control unit 11 converts the logical address specified by the read request into a physical address using the above-mentioned address conversion table, and instructs the memory I/F 13 to read from the physical address.

In the NAND memory, writing and reading are generally performed in data units called pages, and erasing is performed in data units called blocks. In the present embodiment, a plurality of memory cells connected to the same word line are referred to as memory cell groups. In a case where the memory cell is a single-level cell (SLC), one memory cell group corresponds to one page. In a case where the memory cell is a multi-level cell (MLC), one memory cell group corresponds to a plurality of pages. In addition, each memory cell is connected to a word line and also to a bit line. Therefore, each memory cell can be identified by an address that identifies a word line and an address that identifies a bit line.

In addition, in response to the read instruction by the memory controller 10, the NAND memory reads data from the plurality of memory cells by applying a read voltage to the word line, and transmits the read data to the memory controller 10.

The memory cell is, for example, a field effect transistor. The memory cell includes a semiconductor layer, a gate insulating film, and a gate electrode. The gate insulating film includes a charge storage layer (an insulating film or a conductive film). The charge amount in the charge storage layer corresponds to any of the plurality of distributions (threshold voltage distributions). The voltage to be applied to the word line when reading data from a plurality of memory cells changes according to the charge amount in the charge storage layer.

In order to simplify the description, an example of 1 bit/cell in which one memory cell stores one bit will be described. In a case of 1 bit/cell, one of the two threshold voltage distributions corresponds to "0", and the other corresponds to "1". When a voltage is applied to the word line, a current may flow or may not flow when the voltage is applied, with a voltage value corresponding to the charge amount of the memory cell as a boundary. This boundary voltage is determined according to the charge amount of the memory cell. The voltage determined according to the charge amount of the memory cell is referred to as a threshold voltage or a reference read voltage. The NAND memory is capable of determining whether the data stored in the memory cell is 1 by applying a reference read voltage to the word line.

Hereinafter, reading data from the memory cell as a hard decision value (i.e., binary value) of 1 or 0 is referred to as a hard bit read. In the hard bit read by the memory controller 10, the reference read voltage is applied as the read voltage to the word line connected to the memory cell, it is determined whether the data stored in the memory cell is 1 or 0, and the determined result is output to the memory controller 10 as read data. In addition, in the hard bit read, the read voltage may be changed from the reference read voltage, and in this case, the difference between the read voltage and the reference read voltage is designated by the read instruction from the memory controller 10.

The data buffer 12 temporarily stores the user data received from the host 30 by the memory controller 10 until the user data is stored in the non-volatile memory 20. Further, the data buffer 12 temporarily stores the user data read from the non-volatile memory 20 until the user data is transmitted to the host 30. For the data buffer 12, for example, a general-purpose memory such as static random access memory (SRAM) or dynamic random access memory (DRAM) may be used.

The user data transmitted from the host 30 is transferred to the internal bus 16 and temporarily stored in the data buffer 12. The encoding/decoding unit 14 encodes the user data to generate a codeword. Further, the encoding/decoding unit 14 decodes the received word read from the non-volatile memory 20 and obtains the user data. Therefore, the encoding/decoding unit 14 includes an encoder 17 and a decoder 18. The data encoded and decoded by the encoding/decoding unit 14 may include control data or the like used inside the memory controller 10 in addition to the user data.

Next, the write operation of the present embodiment will be described. The control unit 11 instructs the encoder 17 to encode the user data when writing the user data to the non-volatile memory 20. At that time, the control unit 11 determines a storage location (storage address) of the code- word in the non-volatile memory 20, and also instructs the memory I/F 13 of the determined storage location.

The encoder 17 encodes the user data on the data buffer 12 to generate a codeword based on the instruction from the control unit 11. As the encoding method, for example, it is possible to adopt an encoding method using an error- correction code including a Hamming code in at least a part of the internal structure. The error-correction code including the Hamming code in at least a part of the internal structure is, for example, the Hamming code, a Reed-Solomon (RS) code or a concatenated code in which at least one of the Hamming code and the RS code is used as a component code. The concatenated code is a code created by combining a plurality of codes, and includes, for example, a product code.

The error-correction code is configured with at least one or more symbols as a configuration unit. Further, one symbol has, for example, 1 bit (element of binary field) or an alphabetic element such as a finite field other than a binary field. In order to facilitate the description, an error-correc- tion code of a binary field in which one symbol has 1 bit will be described below as an example. In description, both symbols and bits may be used in the coexist manner, but both have the same meaning.

In the first embodiment, an example of using the Ham- ming code will be described. An example of using the RS code will be described in the second and third embodiments. The memory I/F 13 operates to store codewords in a storage location on the non-volatile memory 20 instructed by the control unit 11.

Next, processing at the time of reading from the non- volatile memory 20 of the present embodiment will be described. When reading from the non-volatile memory 20, the control unit 11 specifies an address on the non-volatile memory 20 and instructs the memory I/F 13 to read. Further, the control unit 11 instructs the decoder 18 to start decoding. The memory I/F 13 reads a received word from the specified address of the non-volatile memory 20 according to the instruction of the control unit 11, and inputs the read received word to the decoder 18. The decoder 18 decodes the received word read from the non-volatile memory 20.

Figure 2:
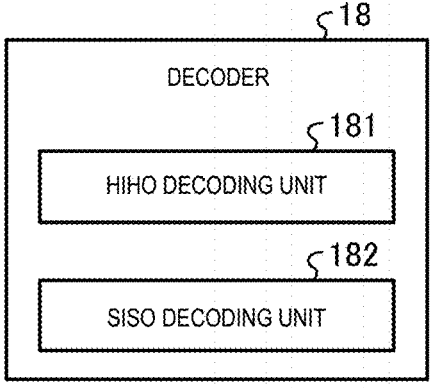
FIG. 2 is a block diagram showing a schematic configuration example of a decoder.

The decoder 18 decodes the received word read from the non-volatile memory 20. FIG. 2 is a block diagram showing a schematic configuration example of the decoder 18. The decoder 18 includes a hard-input hard-output (HIHO) decoding unit 181 that executes decoding of a hard decision value as an input and outputs the hard decision value as a result, and a soft-input soft-output (SISO) decoding unit 182 that executes decoding of a soft decision value (may be referred to as soft decision input value or soft decision input data) as an input and outputs a soft decision value (may be referred to as soft decision output value or soft decision output data) as a result.

In general, SISO decoding has a feature of higher error- correction capability than HIHO decoding but longer pro- cessing time. In consideration of such a feature, in the present embodiment, first, the HIHO decoding unit 181 is configured to HIHO decode the received word read from the non-volatile memory 20 as a hard decision value and read the received word that cannot be decoded by the hard decision decoding as a soft decision value. Then, the SISO decoding unit 182 is configured to perform SISO decoding of the received word read as a soft decision value. However, the present embodiment is not limited to such configuration, and various modifications may be made such as a configu- ration in which HIHO decoding is omitted and SISO decod- ing is executed for all received words.

The SISO decoding unit 182 may include a memory (read information memory) that stores read information (received word) read from the non-volatile memory 20 by soft deci- sion. In the read information, the data corresponding to a hard decision value, which is binary information that deter- mines whether each bit is 0 or 1, may be referred to as hard bit data. Further, the data corresponding to the portion of the read information excluding the hard bit data may be referred to as soft bit data. The read information memory may include a hard bit memory (HMEM) for storing hard bit data and a soft bit memory (CMEM) for storing soft bit data.

Decoding processing may require data called a channel value. The channel value indicates the value of the log- likelihood ratio (LLR) corresponding to the set of hard bit data and soft bit data. The channel value may be referred to as a channel LLR data. The channel value is determined, for example, by an LLR table in which a set of hard bit data and soft bit data and a channel value are associated with each other. The channel value is an example of a soft decision input value based on the read information of the soft decision read from the non-volatile memory 20.

For example, in reading by soft decision (soft bit read), one piece of hard bit data and a plurality of pieces of soft bit data are obtained. One piece of hard bit data is obtained using a single read voltage (hereinafter, referred to as VrH) as the read voltage used for reading by hard decision (hard bit read). The plurality of soft bit data are obtained using a plurality of read voltages including a read voltage having a value smaller than VrH and a read voltage having a value greater than VrH. The LLR table is, for example, a table in which a channel value is associated with each set of one hard bit data and a plurality of soft bit data. The SISO decoding unit 182 may determine the corresponding channel value from one piece of hard bit data and a plurality of pieces of soft bit data provided in the read information using such an LLR table.

In the present embodiment where the symbol is an ele- ment in a binary field, the LLR indicates probability infor- mation about whether a bit is 0 or 1. In the following, LLR is assumed to be positive when the probability that the bit is 0 is high, and negative when the probability that the bit is 1 is high. In the present embodiment, the soft decision input value and the soft decision output value are also expressed by the LLR.

LLR can be expressed by reducing a value to binary information of 0 or 1 depending on whether the value is positive or negative. In the following, such binary informa- tion may be referred to as a hard decision value (or a hard decision data) of LLR. Further, in the following, when LLR is positive, the hard decision value is set to 0, when LLR is negative, the hard decision value is set to 1, and when LLR is 0, the hard decision value is determined according to a predetermined rule (for example, the hard decision value is set to 0).

The "hard decision value of a channel value" corresponds to the information in which the channel value represented by LLR is represented by a binary value depending on a positive value or a negative value as described above. Similarly, the "hard decision value of a soft decision input value" corresponds to the information in which the soft decision input value represented by LLR is represented by a binary value depending on a positive value or a negative value as described above.

As a SISO decoding for a Hamming code, a decoding method that executes list decoding to find a plurality of decoded words and calculates a soft decision output value by Max-Log-MAP (Maximum A Posteriori) method using a metric for each of the found plurality of decoded words, may be used. Hereinafter, an outline of a comparative example that executes the decoding method will be described. FIG. 3 is a diagram showing an example of a flow of decoding processing according to a comparative example.

In the Max-Log-MAP method, for example, the soft decision output value $L_i^{(out)}$ is calculated according to the following Equation (1).

Equation 1

$$L_i^{(out)} = \text{sgn}(L_i^{(in)}) * \left( \min_{D \in \mathcal{D}_i^{(c)}} M(D) - \min_{D \in \mathcal{D}_i^{(nc)}} M(D) \right) \quad (1)$$

i represents a position (address) of n bits (n is an integer greater than or equal to 2) provided in the soft decision value (soft decision input value and soft decision output value). For example, i is an integer satisfying $0 \leq i \leq n-1$. n corresponds to a code length of the Hamming code. $L_i^{(in)}$ represents a value of a bit (hereinafter, referred to as bit i) at the address i of the soft decision input value. sgn(a) represents a function that outputs a sign of a. M (decoded word) represents a metric for a decoded word. $D_i^{(c)}$ represents a set of a decoded word correcting bit i. $D_i^{(nc)}$ represents a set of a decoded word not correcting bit i.

The metric is an index corresponding to a distance between the soft decision input value and the decoded word. The metric is calculated based on, for example, a sum of absolute values of soft decision input values at correction positions, but may be calculated by any other method.

The first term in parentheses in which a difference on a right-hand side of Expression (1) is calculated corresponds to the minimum metric among metrics for a plurality of decoded words correcting bit i. The second term corresponds to the minimum metric among metrics for a plurality of decoded words not correcting bit i.

In the comparative example, two (two-dimensional) metric arrays are used to indicate the metric used in the calculation of Equation (1). Each metric array includes n (code length) metrics. The two metric arrays are a metric array with correction and a metric array without correction. In the metric array with correction, the metric of the found decoded word is added to a position of the bit corrected by the found decoded word. In the metric array without correction, the metric of the found decoded word is added to a position of the bit that is not corrected by the found decoded word.

In addition, in the comparative example, for example, the soft decision output value indicating the decoding result with respect to the soft decision input value is calculated according to the following procedure.

(A1) A syndrome is calculated from a hard decision value of the soft decision input value.

(A2) A two-dimensional metric array is updated while executing list decoding using the syndrome.

(A3) A soft decision output value is calculated using the two-dimensional metric array.

FIG. 3 corresponds mainly to a diagram showing a specific example of processing (A2). FIG. 3 shows an example of updating the two-dimensional metric array when three decoded words are found. In addition, FIG. 3 shows an example in which the soft decision input value of the code length n=5 in which a bit at the addresses 0 to 4 are 1, 2, 3, 4, and −5, respectively, is input. More specifically, a syndrome (not shown) is obtained from the hard decision value (hard decision value of the input soft decision input value) shown in FIG. 3, and the decoded words $D^{(1)}$ to $D^{(3)}$ shown in FIG. 3 are found by executing list decoding such as Chase decoding and ordered statistics decoding (OSD) using the calculation result of the syndrome. The syndrome is calculated, for example, by multiplying a parity check matrix of the error-correction code and the hard decision value.

In the first found decoded word $D^{(1)}$, the bit at the address 4 (bit 4) is corrected. In this case, the metric of the decoded word $D^{(1)}$ is calculated as 5, which is the sum of the absolute values of the soft decision input values "−5" at the correction position (address 4).

In the two-dimensional metric array, the calculated metric is added to a position corresponding to the correction position (address 4) of the metric array with correction, and the calculated metric is added to positions (addresses 0 to 3) other than the correction position of the metric array without correction.

Similarly, metrics 7 and 3 are calculated for the second and third found decoded words $D^{(2)}$ and $D^{(3)}$, and the metrics of the positions corresponding to the correction positions are updated in each of the two metric arrays.

As described above, in the comparative example, processing for the code length to update the two-dimensional metric array is required each time a decoded word is found.

To address such an issue, in the present embodiment, one metric array (one-dimensional metric array) is used, and instead, a memory min1 (first metric memory) that stores a metric (first metric) that is the minimum among the plurality of metrics calculated for the plurality of decoded words and a memory min2 (second metric memory) that stores a metric (second metric) that is second minimum among the plurality of metrics are provided. In the following, the metric stored in the memory min1 may be referred to as metric min1, and the metric stored in the memory min2 may be referred to as metric min2.

When a decoded word is found, the entry at the correction position of the one-dimensional metric array, the memory min1 (metric min1), and the memory min2 (metric min2) are updated using the metric calculated for the decoded word. In the present embodiment, a one-dimensional metric array indicates a metric calculated for a decoded word DA, as a metric of a bit corrected by the decoded word DA (first decoded word) provided in the plurality of decoded words. As described above, in the present embodiment, the processing corresponding to the number of correction positions+2 is required. The processing of only comparing values and the processing of comparing and updating values are not distinguished from each other, and both are considered as one processing. For example, in the case of 1 bit flip decoding, the maximum value of the number of correction positions is 2, and thus the processing number is 4 at the maximum. As described above, in the present embodiment, the amount of calculation is reduced to "the number of correction positions+2" with respect to the amount of calculation for the code length of the comparative example.

Figure 4:
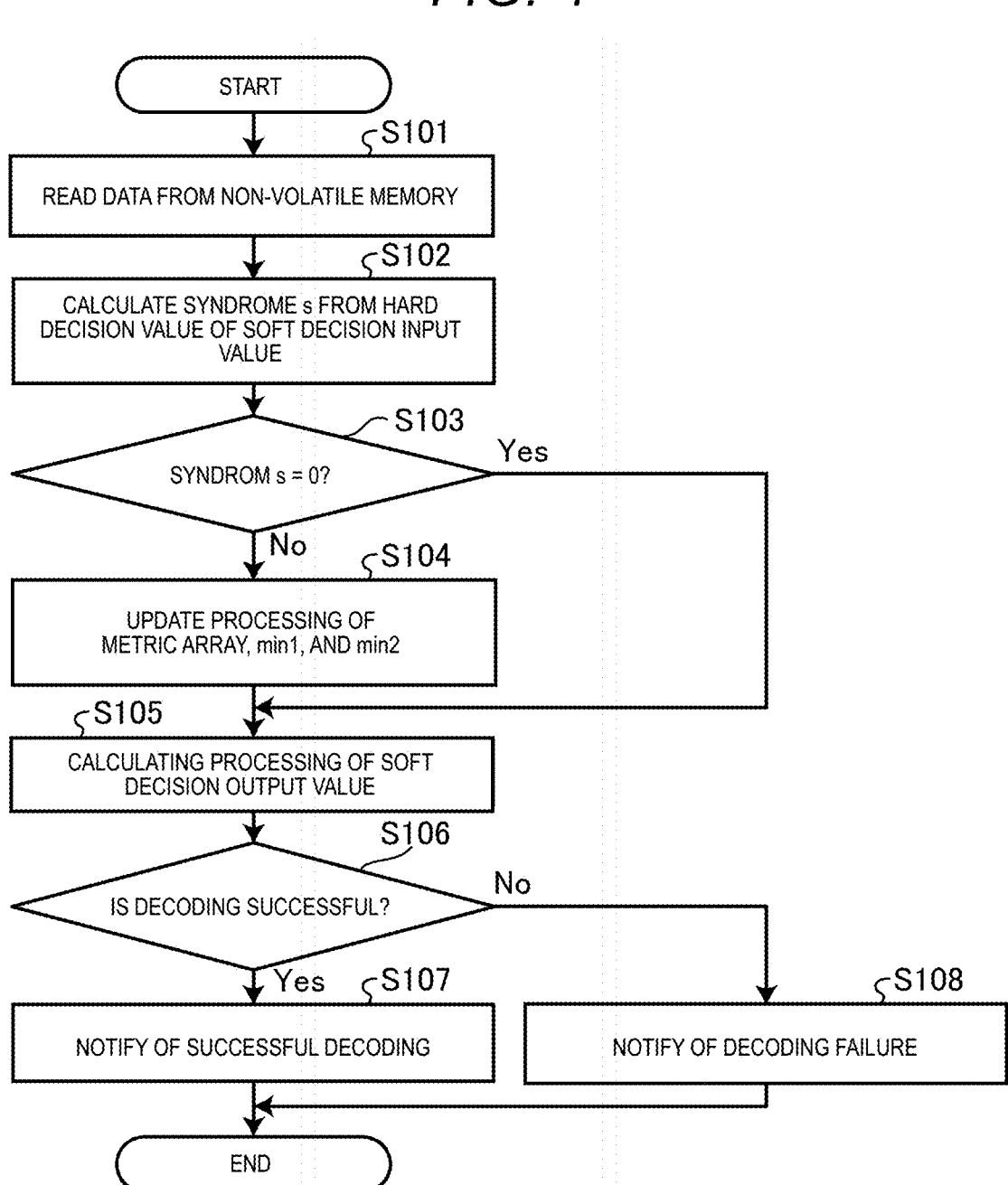
FIG. 4 is a flowchart of decoding processing by the memory system according to the first embodiment.

Next, a flow of decoding processing by the memory system 1 according to the first embodiment will be described. In the following, an example of applying 1 bit flip decoding as the SISO decoding for the Hamming code will be described. FIG. 4 is a flowchart showing an example of decoding processing by the memory system according to the first embodiment.

The control unit 11 reads the error-correction code from the non-volatile memory 20 and obtains the read information (step S101). The control unit 11 transfers the obtained read information to, for example, the read information memory in the SISO decoding unit 182 and stores the read information. The read information includes, for example, hard bit data and soft bit data.

The SISO decoding unit 182 calculates the syndrome s from the hard decision value of the soft decision input value (channel value) (step S102). The channel value may be obtained using, for example, the LLR table described above as a log-likelihood ratio corresponding to the hard bit data and the soft bit data provided in the read information. The syndrome s is a symbol string used by the error-correction code to calculate an error position, and is obtained, for example, by multiplying a parity check matrix of the error-correction code and the hard decision value.

The SISO decoding unit 182 determines whether the calculated syndrome s is 0 (step S103). When the syndrome s is not 0 (step S103: No), the SISO decoding unit 182 executes update processing of the metric array, the memory min1, and the memory min2 (step S104). Details of the update processing will be described below.

After the update processing, and when the syndrome s is 0 (step S103: Yes), the SISO decoding unit 182 executes calculating processing of the soft decision output value (step S105). Details of the calculating processing will be described below.

The decoder 18 determines whether the decoding is successful (step S106). Successful decoding may mean, for example, that a decoded word that can be determined to be correct is found. When the decoding is successful (step S106: Yes), the decoder 18 notifies an external control unit or the like of the decoded word with the success of the decoding (step S107), and ends the decoding processing. When the decoding is not successful (step S106: No), the decoder 18 notifies an external control unit or the like of the failure of the decoding (step S108), and ends the decoding processing.

Figure 5:
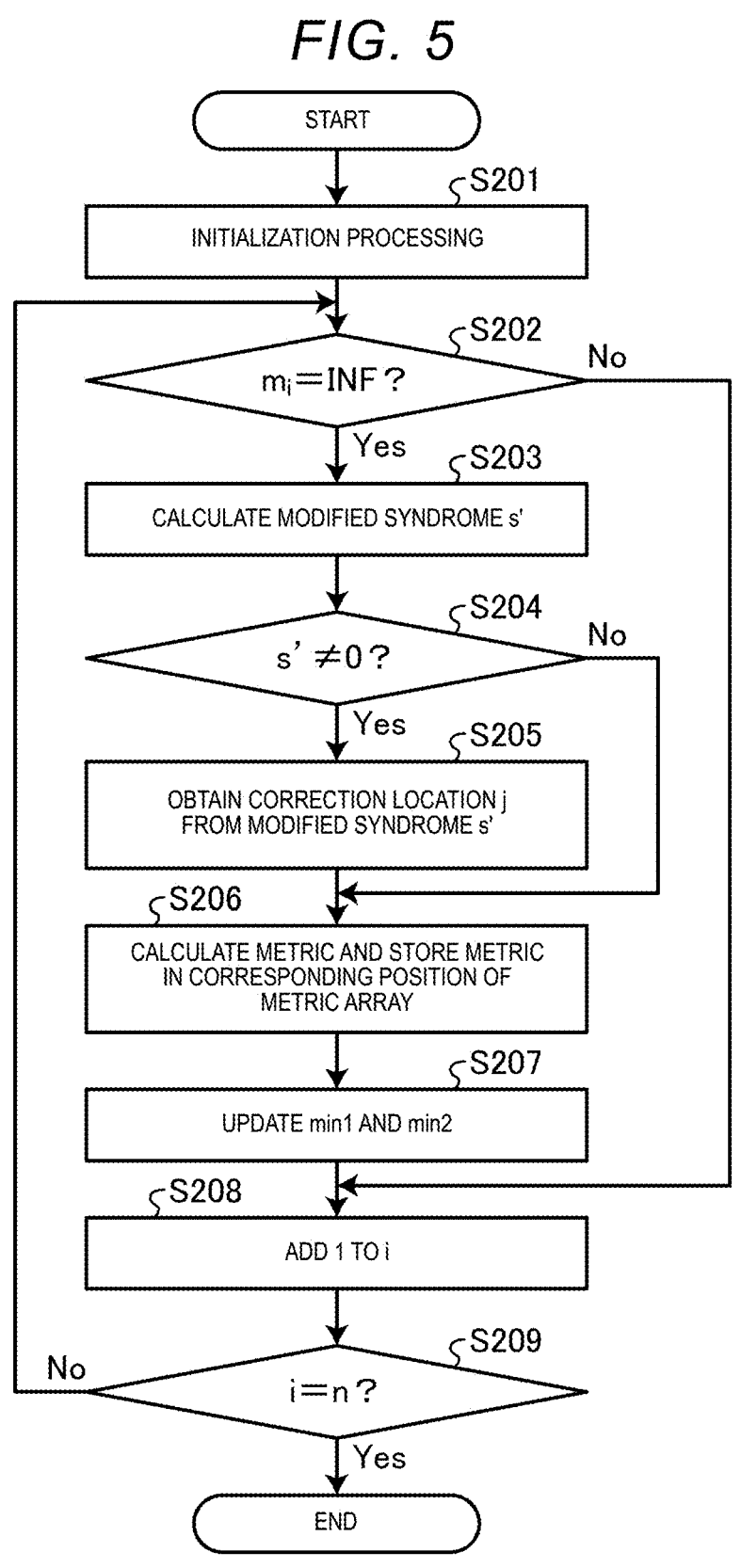
FIG. 5 is a flowchart of update processing by the memory system according to the first embodiment.

Next, the details of the update processing in step S104 will be described. FIG. 5 is a flowchart showing an example of update processing by the memory system according to the first embodiment.

In the update processing, for example, the syndrome s and the absolute value A of the soft decision input value are input, and the metric array m, the metric min1, and the metric min2 are output. The absolute value A is represented by a vector including n elements, such as $A=(A_0, A_1, \ldots, A_{n-1})$. The metric array m is an array including n metrics, and is represented, for example, as $m=(m_0, m_1, \ldots, m_{n-1})$.

The SISO decoding unit 182 executes initialization processing of various parameters used for the update processing (step S201). The parameters include, for example, the address i of the target bit, metrics $m_i$ (i=0, 1, ..., n−1) which are entries of the metric array, and metrics min1 and min2. The SISO decoding unit 182 initializes these parameters, for example, as follows. The INF represents a predetermined initial value.

Address i=0
$m_0=m_1=\ldots=m_{n-1}=INF$
min1=min2=INF

The SISO decoding unit 182 determines whether the metric $m_i$ is equal to INF at the current address i (step S202). The fact that the metric $m_i$ is not equal to INF, that is, a value different from the initial value is set, represents that a decoded word for correcting the bit at the address i has already been found. Therefore, when the metric $m_i$ is not equal to INF (step S202: No), the SISO decoding unit 182 skips the processing in step S203 to step S207 and transitions to step S208.

When the metric $m_i$ is equal to INF (step S202: Yes), the SISO decoding unit 182 calculates a modified syndrome s' obtained by modifying the syndrome s (step S203). The modified syndrome s' is obtained by reflecting the influence of flipping bit i in the syndrome. For example, the SISO decoding unit 182 calculates the modified syndrome s' by performing an exclusive OR between the syndrome s and the i-th column vector hi of the parity check matrix.

The SISO decoding unit 182 determines whether the modified syndrome s'≠0 (step S204). The fact that the modified syndrome s'=0 represents that a decoded word with a correction position of 1 bit has been found.

When the modified syndrome s'≠0 (step S204: Yes), the SISO decoding unit 182 obtains a correction position j from the modified syndrome s' (step S205). For example, the SISO decoding unit 182 may obtain the correction position j for the modified syndrome s' using the corresponding information (a table or the like) for outputting the correction position for the input syndrome.

After the correction position j is obtained, or when it is determined in step S204 that the modified syndrome s'≠0 is not satisfied (step S204: No), the SISO decoding unit 182 calculates the metric $m_i$ using the soft decision input value, the modified syndrome s', and the correction position j, and adds the calculated metric $m_i$ in the corresponding position of the metric array (step S206). The corresponding position includes a position corresponding to the bit i and a position corresponding to the correction position j when the correction position j is a valid position.

For example, the SISO decoding unit 182 calculates the metric $m_i$ according to the conditions of the modified syndrome s' and the correction position j, for example as follows.

When s'=0, $m_i=A_i$.
When s'≠0 and the correction position j is a valid position, $m_i=m_j=A_i+A_j$.
When s'≠0 and the correction position j is an invalid position, $m_i=A_i+B$ For the value B, for example, the following values may be used.

(B1) A predetermined fixed value (may be referred to as predetermined constant)
(B2) A value obtained by multiplying an average value of absolute values of soft decision input values in a plurality of bits (for example, bit 0 to bit n−1) by 2.

Here, a valid position and an invalid position will be described. When the Hamming code on the Galois field $GF(2^m)$ is not shortened, a code length is $n=2^{m-1}$, and an information length is $k=n-m=2^m-1-m$. Here, by treating a part of the information bits, for example, s bits as being fixed to 0, a shortened Hamming code having a code length of $n=2^m-1-s$ and an information length of $k=2^m-1-m-s$ may be considered. At this time, among positions of a length $(2^m-1)$ of an original code length, a position fixed to 0 by shortening is referred to as an "invalid position", and other positions are referred to as "valid positions".

The method of fixing the s bits is not limited to the method of fixing the s-bit to 0, and may be a method of fixing the s-bit to 1 or a method of changing whether to fix the s-bit to 0 or 1 depending on the bit. However, in most cases, it is common to fix all the positions for shortening to 0. This is because, when the value is 0, the contribution of the position to be shortened may simply be 0 during encoding and syndrome calculation.

Next, a reason for changing a method of calculating the metric according to whether the correction position j is a valid position or an invalid position will be described.

In step S205, as described above, an m-bit correction position j corresponding to the m-bit syndrome s' is obtained by referring to the corresponding information (table). The m bits of input (absolute value of the syndrome and the soft decision input value) and the m bits of output (metric array) correspond to each other in a one-to-one manner. When the syndrome is 0, it means that there is no correction position, so when the syndrome is 0, the step S205 of referring to the corresponding information is skipped.

When the Hamming code is shortened, the correction position j obtained using the corresponding information may correspond to an "invalid position". This means that the situation where a decoded word correcting 2 bits, including position i, is not found, that is, the situation where there are at least 2 other correction positions when the position i is the correction position. Within the range of 1 bit flip decoding, it is not possible to discover a correction position in such situations.

Tho address such an issue, in the present embodiment, when the correction position j corresponds to an "invalid position", the metric is calculated approximately. The above $m_i=A_i+B$ corresponds to a metric calculated approximately.

The reason why a value obtained by multiplying the average value of the absolute value of the soft decision input value in a plurality of bits by 2 is used as the value B as in (B2) is that it is considered reasonable to assume that there are other 2-bit correction positions and the contribution of these positions is the average value of the entire. However, when the amount of calculation for calculating the average value increases, using a predetermined fixed value (B1) may be adopted. The fixed value may be determined by a pre-evaluation or the like as a value corresponding to twice the average value.

The SISO decoding unit 182 may set the bit corresponding to the invalid position (position where the decoded word to be corrected is not found) of the soft decision output value to a predetermined fixed value.

Returning to the description of FIG. 5. The SISO decoding unit 182 updates the memory min1 and the memory min2 (step S207). For example, the metric calculated for the first found decoded word is the minimum metric, and therefore, is stored in the memory min1. When the metric calculated for the second or subsequent found decoded word is smaller than the metric previously stored in the memory min1, the metric stored in the memory min1 is stored in the memory min2, and the newly calculated metric is stored in the memory min1. When the metric calculated for the second or subsequent found decoded word is greater than the metric previously stored in the memory min1 and is smaller than the metric previously stored in the memory min2, the newly calculated metric is stored in the memory min2.

The SISO decoding unit 182 adds 1 to the address i (step S208), and determines whether the address i after the addition satisfies i=n (step S209). When i does not satisfy i=n (step S209: No), the process by the SISO decoding unit 182 returns to step S202 and the SISO decoding unit 182 repeats the processing. When i=n (step S209: Yes), the SISO decoding unit 182 ends the update processing.

Figure 6:
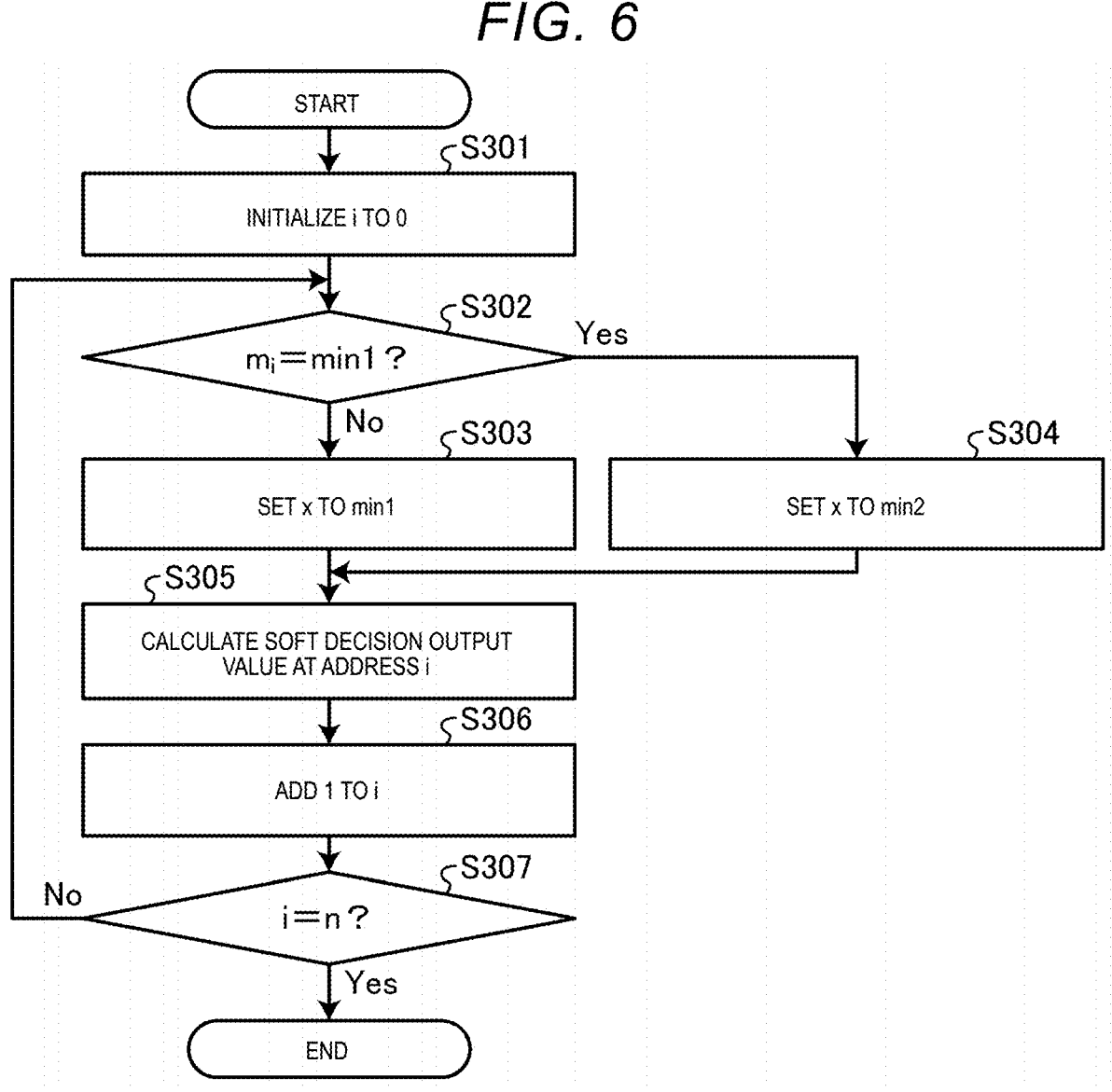
FIG. 6 is a flowchart of calculating processing by the memory system according to the first embodiment.

Next, the details of the calculating processing in step S105 will be described. The calculating processing is divided into two types, a case where the syndrome s is determined not to be 0 in step S103 and a case where the syndrome s is determined to be 0. First, calculating processing when the syndrome s is determined not to be 0 will be described with reference to FIG. 6. FIG. 6 is a flowchart showing an example of calculating processing by the memory system of the first embodiment.

In the calculating processing, for example, input data and output data as follows are used.

Input Data:

Sign of each bit of the soft decision input values (sgn $(L_0^{(in)})$, $\mathrm{sgn}(L_1^{(in)})$, . . . , and $\mathrm{sgn}(L_{n-1}^{(in)})$)

Metric array $m=(m_0, m_1, \ldots, m_{n-1})$

Metrics min1, min2

Output Data:

Soft decision output value $L^{(out)}=(L_0^{(out)}, L_1^{(out)}$, and $L_{n-1}^{(out)})$.

When an output format (that is, a decoded word) in the form of a bit sequence is desired instead of the soft decision output value (LLR sequence), a hard decision value of the soft decision output value may be output as output data.

The SISO decoding unit 182 initializes the address i to 0 (step S301). The SISO decoding unit 182 determines whether the metric $m_i$ is equal to the metric min1 using the current address i (step S302). When the metric $m_i$ is not equal to the metric min1 (step S302: No), the SISO decoding unit 182 sets the variable x to the metric min1 (step S303). When the metric $m_i$ is equal to the metric min1 (step S302: Yes), the SISO decoding unit 182 sets the variable x to the metric min2 (step S304).

The SISO decoding unit 182 calculates a soft decision output value at the address i (step S305). For example, the SISO decoding unit 182 calculates the soft decision output value $L_i^{(out)}$ according to the following Equation (2).

Equation 2

$$L_i^{(out)} = \mathrm{sgn}\big(L_i^{(in)}\big) * (m_i - x) \tag{2}$$

Equation (2) corresponds to an equation obtained by rewriting the Equation (1) using that the "minimum metric among metrics for a plurality of decoded words not correcting bit i" (second term in parentheses) is the metric min1 or min2.

A value of $(m_i-x)$ in the Equation (2) corresponds to a subtraction value obtained by subtracting the metric min2 from the metric $m_i$ when the metric $m_i$ and the metric min1 are equal to each other (step S302: Yes), or a subtraction value obtained by subtracting the metric min1 from the metric $m_i$ when the metric $m_i$ and the metric min1 are not equal to each other (step S302: No). The value of $(m_i-x)$ with respect to each address i may be referred to as a first value.

The soft decision output value $L_i^{(out)}$ obtained according to the Equation (2) is obtained as a multiplication result of the subtraction value and the sign sgn $(L_i^{(in)})$ of the soft decision input value at the address i and may be referred to as a second value for each address i. The soft decision output value $L_i^{(out)}$ represents probability information that each bit is 0 or 1 in the form of LLR and may be referred to as a posteriori value (posteriori LLR).

A single bit may be protected by a plurality of code constraints, such as when a plurality of codes are concatenated and used (for example, a product code). As a decoding method in such a case, a decoding method (turbo decoding) in which decoding processing is first executed under a first code constraint (hereinafter, code constraint C1), and then decoding processing is executed under a second code constraint (hereinafter, code constraint C2) after obtaining probability information from the code constraint C1, may be used. In such a decoding method, the probability information (in the form of LLR) from the code constraint C1 to the code constraint C2 is referred to as an extrinsic value (extrinsic LLR). On the code constraint C2 side, the sum of the channel LLR data and the extrinsic LLR is used as a soft decision input value for the decoding processing. In this way, the sum of the channel LLR data and the extrinsic LLR may be used as the soft decision input value based on the read information.

When such a code is used, the SISO decoding unit 182 may output, as the soft decision output value $L_i^{(out)}$, an extrinsic value (extrinsic LLR) calculated using the following Equation (3) instead of the Equation (2).

Equation (3) is an equation for calculating a value based on an extrinsic value obtained by subtracting the value $L_i^{(in)}$ of the bit at the address i of the soft decision input value from the a posteriori value as the soft decision output value $L_i^{(out)}$. The extrinsic value may be referred to as a third value for each address i. The value based on the extrinsic value is, for example, a value obtained by multiplying the extrinsic value by a scale factor c to be described below.

Equation 3

$$L_i^{(out)} = c * \left\{ \text{sgn}\left(L_i^{(in)}\right) * (m_i - x) - L_i^{(in)} \right\} \quad (3)$$

In the decoding processing, processing of executing some form of approximation may be executed. In such a case, the accuracy of the extrinsic LLR is reduced as compared with an ideal (without approximation) decoding processing. In particular, the accuracy is often deteriorated in a direction in which the absolute value of the extrinsic LLR increases. A scale factor may be used as a measure to reduce such deterioration.

c in the Equation (3) corresponds to such scale factor. The scale factor c is, for example, a fixed value between 0 and 1. As described above, the scale factor c is used to reduce the amplitude of the extrinsic LLR and to reduce the deterioration of the decoding accuracy when the extrinsic value is used.

Returning to the description of FIG. 6. The SISO decoding unit 182 adds 1 to the address i (step S306), and determines whether the address i after the addition satisfies i=n (step S307). When i does not satisfy i=n (step S307: No), the process by the SISO decoding unit 182 returns to step S302 and the SISO decoding unit 182 repeats the processing. When i=n (step S307: Yes), the SISO decoding unit 182 ends the calculating processing.

Next, calculating processing when the syndrome s is determined to be 0 will be described. In the calculating processing in this case, for example, input data and output data as follows are used.

Input Data:
  Sign of each bit of the soft decision input values (sgn $(L_0^{(in)})$, sgn$(L_1^{(in)})$, . . . , and sgn$(L_{n-1}^{(in)})$)

Output Data:
  Soft decision output value $L^{(out)} = (L_0^{(out)}, L_1^{(out)}, \ldots$, and $L_{n-1}^{(out)})$.
  As described above, when an output format (that is, a decoded word) in the form of a bit sequence is desired instead of the soft decision output value (LLR sequence), a hard decision value of the soft decision output value may be output as output data.

The SISO decoding unit 182 calculates the soft decision output value $L_i^{(out)}$ according to the following Equation (4).

Equation 4

$$L_i^{(out)} = \text{sgn}\left(L_i^{(in)}\right) * W \quad (4)$$

W is a predetermined fixed value. For example, it is possible to use a value calculated as follows as a fixed value.
  Maximum value of the LLR amplitude handled by the decoding unit 182
  A value obtained by multiplying a scale factor (a value between 0 and 1) by a maximum value of an LLR amplitude handled by the decoding unit 182.
  The W may be set to different fixed values depending on whether a posteriori value (posteriori LLR) is output as a soft decision output value or an extrinsic value (extrinsic LLR) is output. For example, a fixed value when a posteriori value is output may be greater than or equal to a fixed value when an extrinsic value is output.

Next, a specific example of the decoding processing according to the first embodiment will be described with reference to FIGS. 7 and 8. FIG. 7 is a diagram showing an example of the update processing according to the first embodiment. FIG. 8 is a diagram showing an example of the calculating processing according to the first embodiment.

FIG. 7 shows an example in which a soft decision input value of a code length n=5 in which a bit at addresses 0 to 4 are 1, 2, 3, 4, and −5, respectively, is input and three decoded words are found, as in FIG. 3. In the present embodiment, 5, which is the metric calculated for the first found decoded word $D^{(1)}$, is added to a position corresponding to the correction position (address 4) of the one-dimensional metric array. Further, the calculated metric (5) is added to the memory min1.

Similarly, the metric 7 and 3 are calculated for the second found decoded words $D^{(2)}$ and the third found decoded word $D^{(3)}$, and the metric of the position corresponding to the correction position of the one-dimensional metric array is updated. Further, the memory min1 and/or the memory min2 are updated according to the magnitude relationship of the values. In the case of 1 bit flip decoding, the amount of calculation in the present embodiment is "the number of correction positions+2".

FIG. 8 shows an example of calculating the soft decision output value $L^{(out)}$ using the metric array and the memories min1 and min2 obtained through the update processing. For example, in the case of the address 0 (i=0), since the metric $m_0$ and the metric min1 are equal to each other (step S302: Yes), the metric min2 is set to x, and 3−5=−2 is calculated as a subtraction value obtained by subtracting x (metric min2) from the metric $m_0$. Since the sign sgn$(L_0^{(in)})$ of the address soft decision input value is positive, the soft decision output value $L^{(out)}$ at the address 0 is −2. The soft decision output value $L_i^{(out)}$ is calculated for other addresses by the same processing.

Modification Example

Until now, an example of applying 1 bit flip decoding as SISO decoding for the Hamming code has been described. The applicable decoding method is not limited to this, and any other applicable decoding method may be used. In the modification example, an example of applying Chase decoding as SISO decoding for the Hamming code will be described. It is possible to apply the present modification example as a modification of second and third embodiments described below. Instead of Chase decoding, the decoding method may be configured to obtain a plurality of decoded words using OSD.

Figure 9:
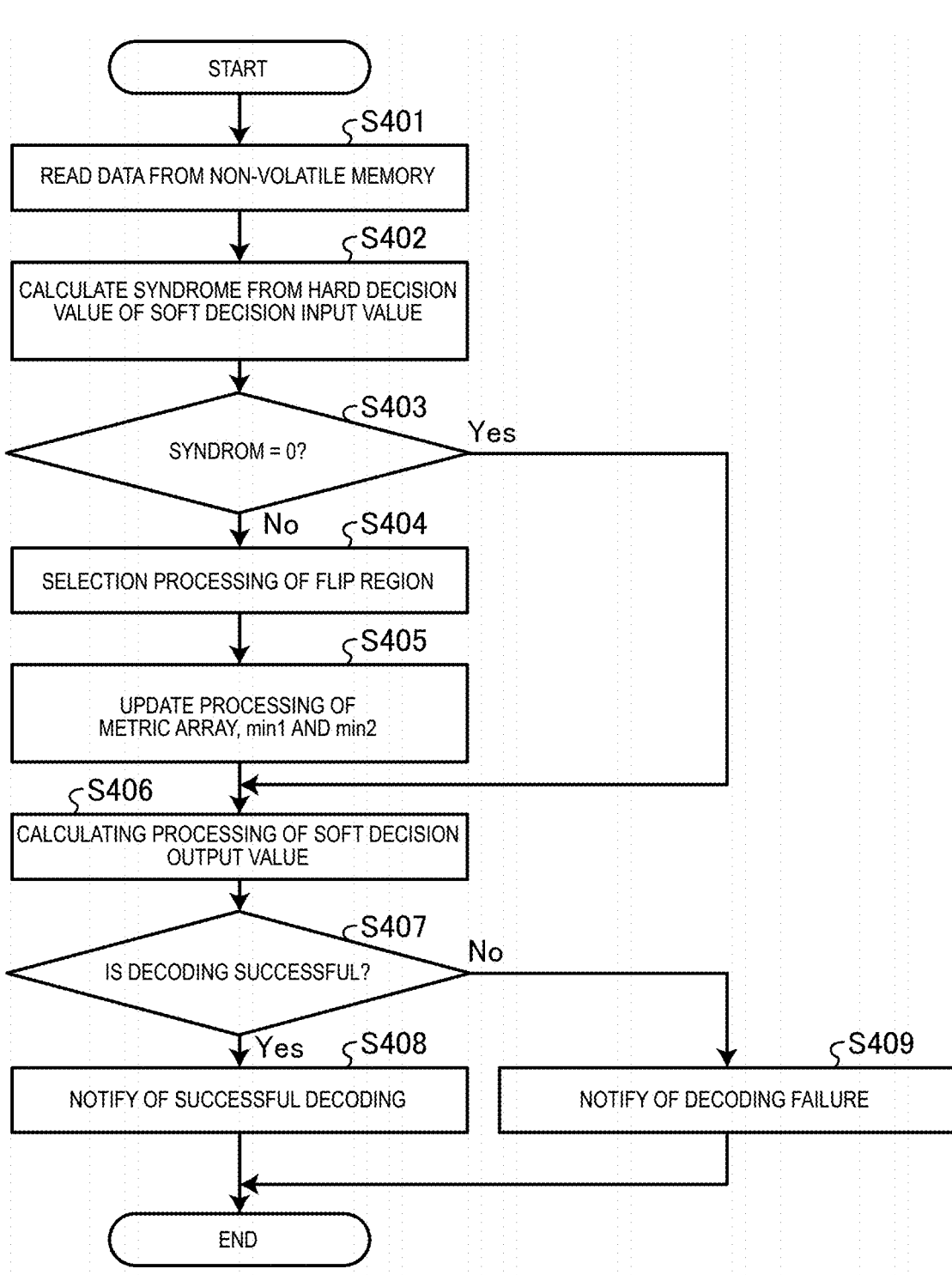
FIG. 9 is a flowchart of decoding processing by a memory system according to a modification example.

FIG. 9 is a flowchart showing an example of decoding processing by the memory system according to the present modification example. In the decoding processing of the modification example, there is a difference from FIG. 4 showing the decoding processing of the embodiment described above in that selection processing (step S404) of the flip area is added. In addition, the update processing of the metric array, the memory min1, and the memory min2 in step S405 are different from the step S104 in FIG. 4. Since the other steps S401 to S403 and the steps S406 to S409 are the same as the steps S101 to S103 and the steps S105 to S108 in FIG. 4, the description thereof will be omitted.

The selection processing of the flip area in step S404 will be described. For example, the SISO decoding unit 182 sorts soft decision input values in ascending order of absolute values, and selects a flip area indicating a range of bits to be flipped (inverted) among the sorted soft decision input values.

Figure 10:
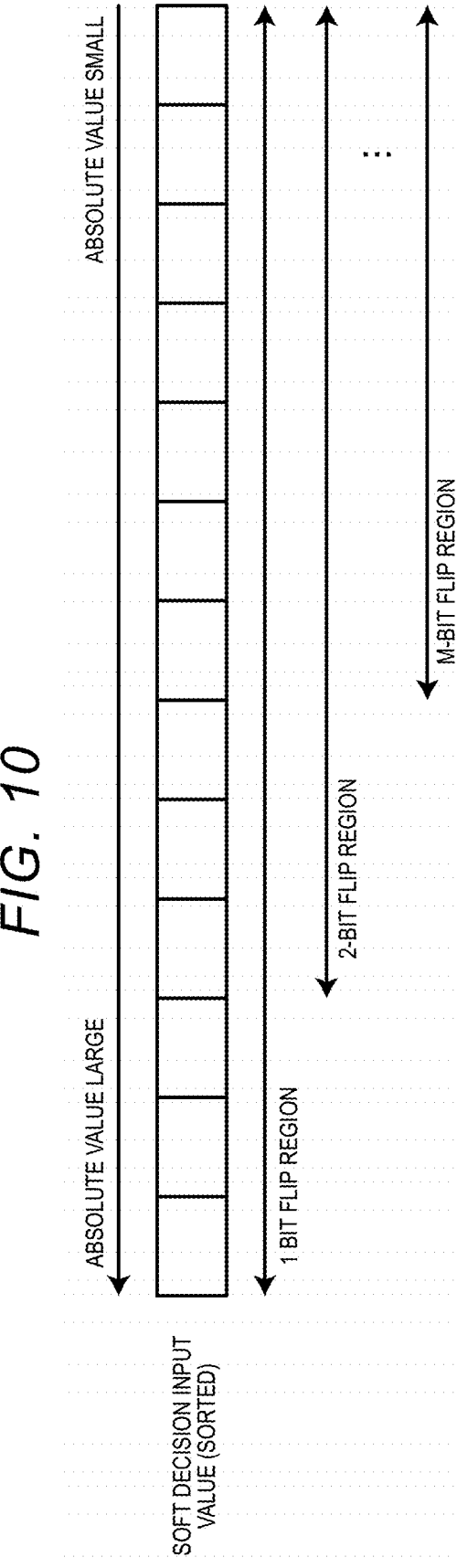
FIG. 10 is a diagram showing an example of a flip area.

FIG. 10 is a diagram showing an example of a flip area. FIG. 10 shows an example in which 13 bits of soft decision input values are sorted in descending order of the absolute values, arranged from left to right. Further, FIG. 10 shows examples of selected flip areas (1 bit flip area, 2-bit flip area, . . . , M-bit flip area).

In the selection processing of flip areas, the values of the parameters are predetermined as follows.

Maximum number of flips M: M is a value greater than or equal to 1.

Flip area list $(f_1, f_2, \ldots, \text{ and } f_M)$, in which n (code length)$\geq f_1 \geq f_2 \geq \ldots \geq f_M \geq M$.

The SISO decoding unit 182 selects a position of the bit to be flipped for each flip number $g=1, \ldots, M$ as follows.

Setting a group of bits with $f_g$ positions to the group of bits to be flipped with the flip number g in ascending order of the absolute values of the soft decision input value.

generating all combinations of g different positions from the group of bits to be flipped with flip number g, and setting each combination as a flip pattern with the flip number g. That is, the total number of flip patterns with the flip number g is represented by the following Equation (5).

Equation 5

$$_{f_g}C_g \tag{5}$$

It is assumed that the total number of all flip patterns is T, and each flip pattern is numbered as $t=0, 1, \ldots, T-1$.

Figure 11:
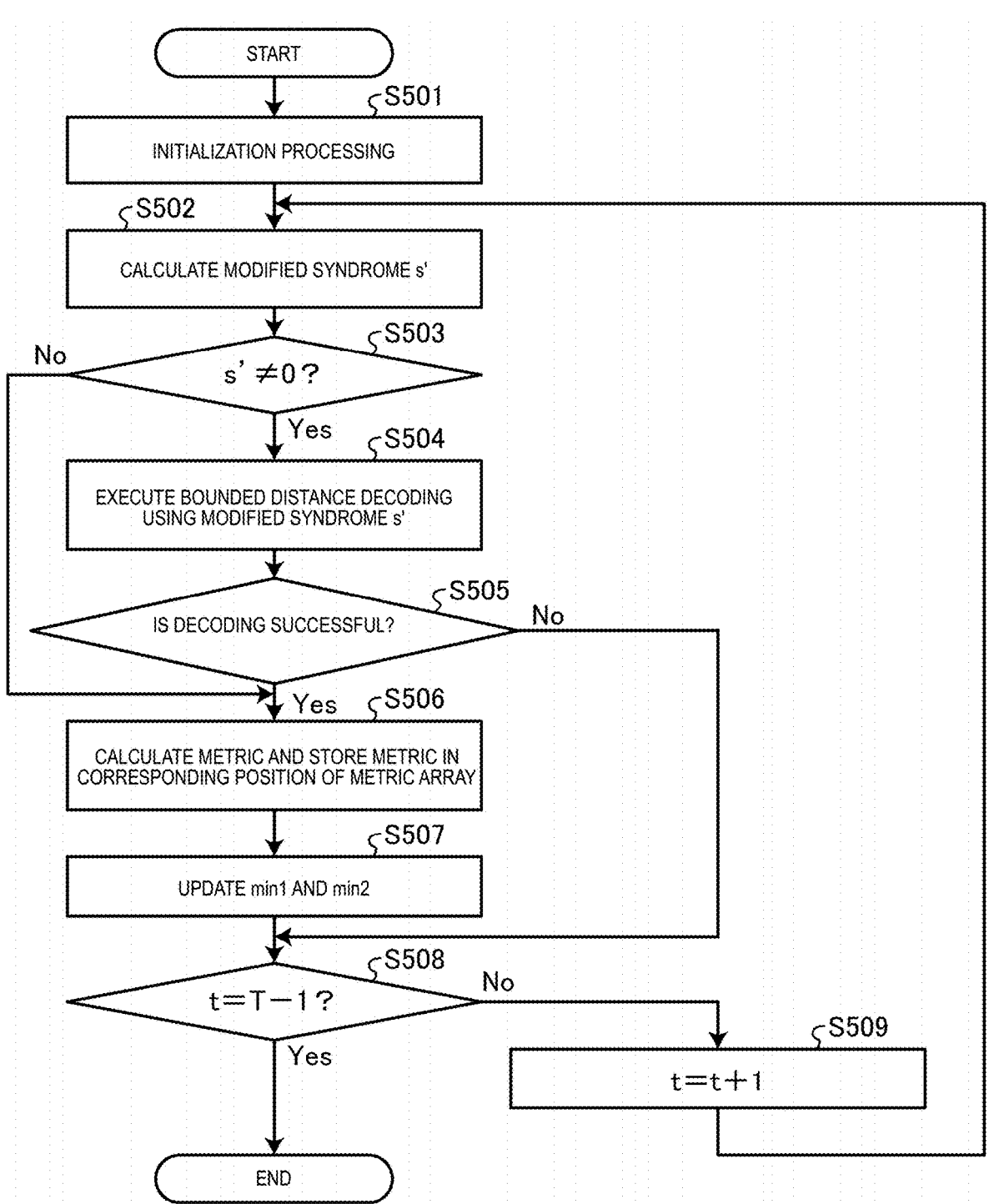
FIG. 11 is a flowchart of update processing by the memory system according to the modification example.

Next, the update processing in step S405 will be described. FIG. 11 is a flowchart showing an example of update processing according to the modification example. The initialization processing in step S501 is the same as step S201 in the update processing (FIG. 5) of the embodiment described above.

The SISO decoding unit 182 calculates a modified syndrome s' obtained by correcting the syndrome s (step S502). The modified syndrome s' is obtained by generating a t-th flip pattern and reflecting an influence of the generated flip pattern on the syndrome s. For example, when the flip position of the flip pattern with the flip number g are denoted by $i_1, i_2, \ldots, \text{ and } i_g$, the exclusive OR between the syndrome s and the $i_1$-th, $i_2$-th, . . . , and $i_g$-th column vectors of the parity check matrix is calculated as a modified syndrome s'.

The SISO decoding unit 182 determines whether the modified syndrome s'≠0 (step S503). When the modified syndrome s'≠0 (step S503: Yes), the SISO decoding unit 182 executes the bounded distance decoding using the modified syndrome s' (step S504).

The SISO decoding unit 182 determines whether the decoding is successful (step S505). When the decoding is successful (step S505: Yes) and when it is determined in step S503 that the modified syndrome s'≠0 is not satisfied (step S503: No), the SISO decoding unit 182 calculates the metric $m_i$, and adds the calculated metric $m_i$ to the corresponding position of the metric array (step S506).

For example, the SISO decoding unit 182 calculates a metric I according to the following Equation (6). Q represents the total number of correction positions found by flip positions and the bounded distance decoding. q is an integer satisfying $1 \leq q \leq Q$. $C_q$ represents a q-th flip position or a correction position.

Equation 6

$$I = \sum_{q=1}^{Q} A_{c_q} \tag{6}$$

The SISO decoding unit 182 compares the value of the metric added to the corresponding position of the metric array with the calculated metric I for each of the positions $C_q$, and adds the metric I to a position corresponding to the position $C_q$ of the metric array when the metric I is smaller.

The updating of the memories min1 and min2 in step S507 is the same as the step S207 of the update processing of the embodiment described above.

After the step S507 and when it is determined in the step S505 that the decoding fails (step S505: No), the SISO decoding unit 182 determines whether t=T−1 is satisfied (step S508). When t=T−1 is not satisfied (step S508: No), the SISO decoding unit 182 adds 1 to t (t=t+1) (step S509), and the process returns to step S502 to repeat the processing.

When t=T−1 is satisfied (step S508: Yes), the SISO decoding unit 182 ends the update processing.

As described above, according to the first embodiment, when the SISO decoding for the Hamming code is executed, the soft decision output value is calculated using a one-dimensional metric array, a memory that stores the minimum metric among the plurality of metrics, and a memory that stores the second minimum metric. According to the present embodiment, it is possible to reduce the amount of calculation to "the number of correction positions+2" as compared with the comparative example in which the amount of calculation for the code length is required due to using a two-dimensional metric array.

Second Embodiment

In the second embodiment, an example of using an RS code will be described. The SISO decoding for the RS code generally requires a large amount of calculation. To address such an issue, a technique has been proposed to execute the SISO decoding by considering the RS code constraint as a combination of a single parity check (SPC) code constraint and a Hamming code constraint. It is possible to execute the SISO decoding for the SPC code constraint easily, for example, by the Min-Sum method. In the present embodiment, the same decoding method as in the first embodiment is used as the SISO decoding for the Hamming code constraint. This makes it possible to achieve the SISO decoding with a reduced amount of calculation as a whole.

Figure 12:
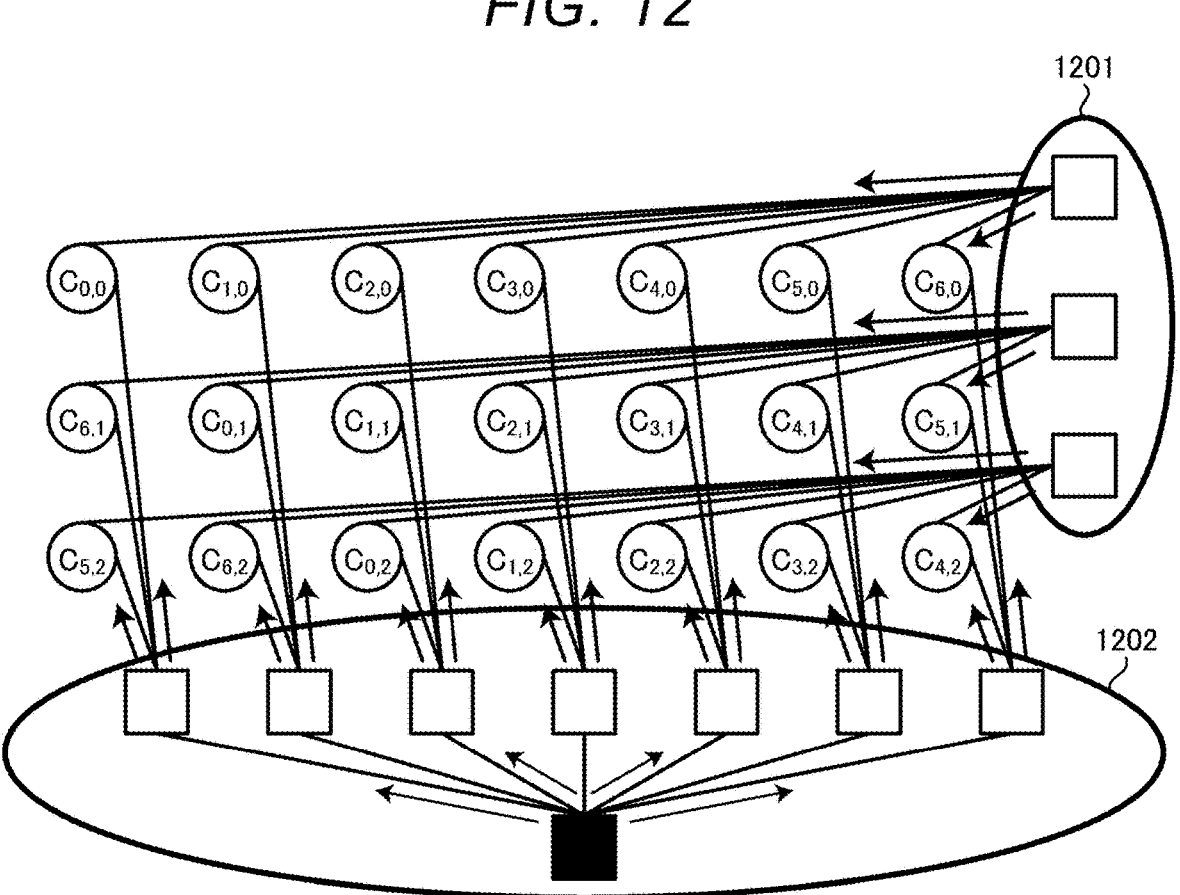
FIG. 12 is a diagram showing an example of a Tanner graph used for decoding an Reed-Solomon (RS) code.

FIG. 12 is a diagram showing an example of a Tanner graph used for decoding an RS code. FIG. 12 is an example of a Tanner graph for an RS code with a code length n=7, an information length k=5, and roots at 1 and $\alpha$ ($\alpha$ is a primitive element on GF($2^3$)) on a Galois field GF($2^3$).

The circles in FIG. 12 represents variable nodes. $c_{i,\,j}$ represents a j-th (j=0, 1, 2) bit of an i-th (i=0, 1, . . . , 6) symbol. The white squares represent check nodes corresponding to the SPC code constraint. The black squares represent check nodes corresponding to the Hamming code constraint. The constraint of the RS code may be interpreted as being divided into a dimension related to the SPC code constraint and a dimension related to the Hamming code constraint. In the following, a dimension related to the SPC code constraint is referred to as a first dimension, and a dimension related to the Hamming code constraint is referred to as a second dimension.

The check node group 1201 includes check nodes corresponding to the first dimension. The check node group 1202 includes check nodes corresponding to the second dimension. In the present embodiment, the decoding of the RS code is achieved by repeatedly executing the first-dimensional SISO decoding and the second-dimensional SISO decoding using the Tanner graph as shown in FIG. 12.

Figure 13:
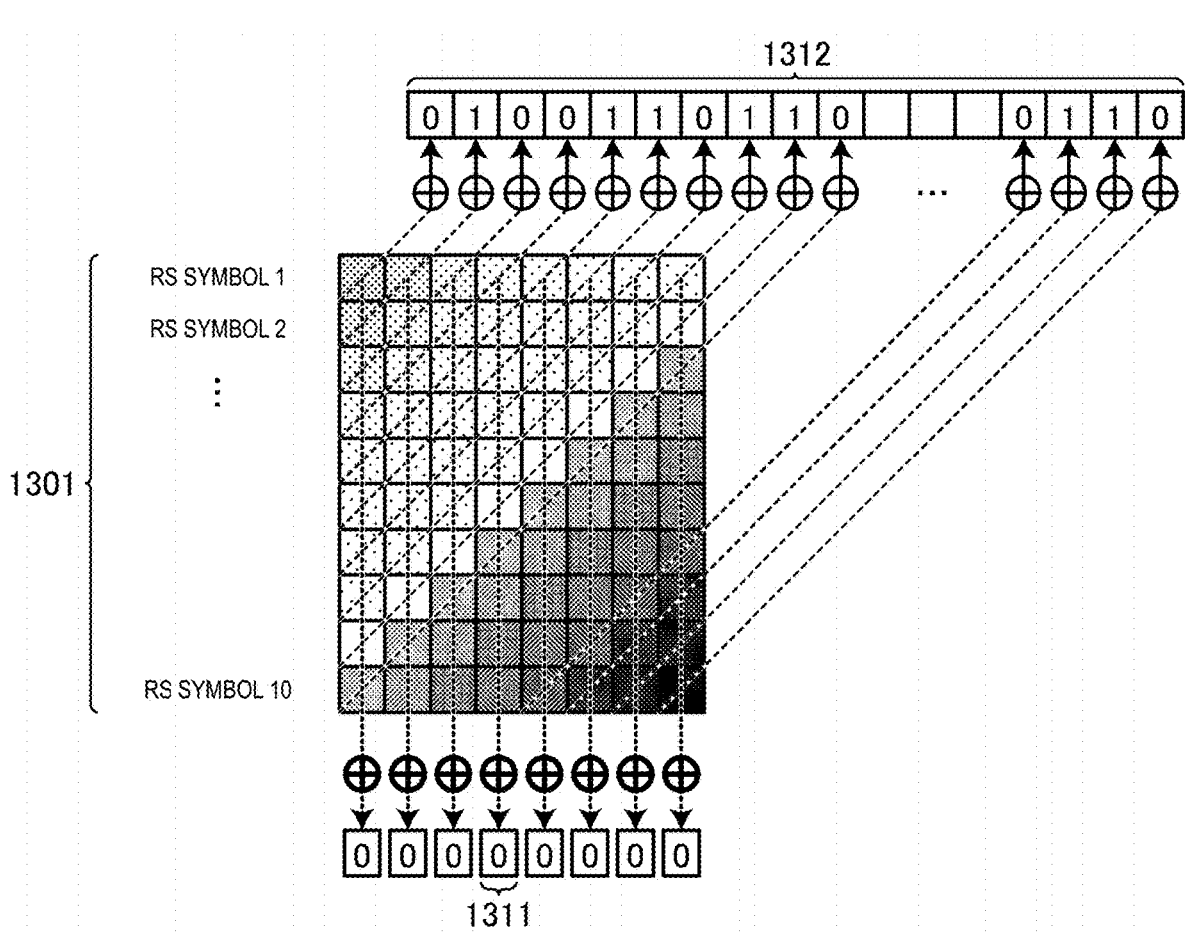
FIG. 13 is a diagram showing an Single Parity-Check (SPC) code constraint and a Hamming code constraint.

FIG. 13 is a diagram showing an SPC code constraint and a Hamming code constraint. The codeword 1301 is a codeword of an RS code with a code length n=10, an information length k=8, and roots at 1 and $\alpha$ ($\alpha$ is a primitive element on GF($2^8$)) on a Galois field GF($2^8$). The codeword 1301 includes ten RS symbols each including eight bits arranged in a horizontal direction in FIG. 13.

An exclusive OR (XOR) of 10 bits contained in each column corresponds to a codeword of the SPC code. A symbol in which a "+" is described in a circle represents a symbol for taking an exclusive OR. For example, the codeword 1311 corresponds to a codeword of the SPC code obtained by XOR of 10 bits in the fourth column. The constraint that each codeword of the SPC code is 0 corresponds to the SPC code constraint.

The codeword 1312 corresponds to a codeword of the Hamming code. Each bit of the codeword 1312 corresponds to each of a plurality of lines (hereinafter, referred to as oblique lines) in an oblique direction as shown in FIG. 13, and is calculated by XOR of one or more bits on the corresponding oblique line. The fact that the codeword 1312 satisfies the Hamming code constraint corresponds to the Hamming code constraint.

Figure 14:
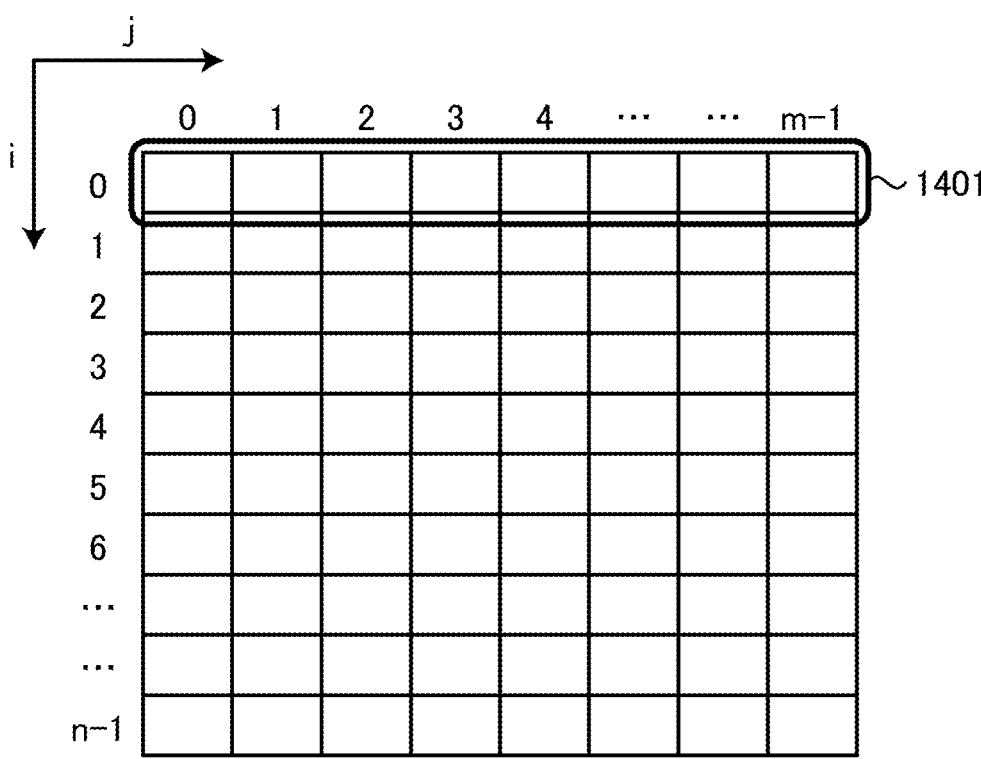
FIG. 14 is a diagram showing an example of an RS frame.

Hereinafter, processing of dividing the constraint of the RS code into two dimensions will be further described. First, an RS code will be described. FIG. 14 is a diagram showing an example of an RS frame. The RS frame is a unit of encoding and decoding of the RS code, and corresponds to the codeword 1301 in FIG. 13, for example.

An RS code with a code length n, an information length (n−2), and a parity length 2 on a Galois field GF($2^m$) is considered. A maximum value $n_{max}$ of the code length is $n_{max}=2^m-1$, and requires to satisfy $3 \leq n \leq n_{max}$. When $n < n_{max}$, it means that the code is shortened. The roots are set to be two, 1 and $\alpha$. $\alpha$ is a primitive element on GF($2^m$).

The RS code (RS frame) includes n symbols. In FIG. 14, one row corresponds to one symbol. For example, the symbol 1401 corresponds to one symbol of the RS code. Each symbol has a size of m bits (the RS code is a multilevel code). In FIG. 14, one cell represents one bit.

The subscript i (0≤i≤n) represents the ordinal position of the symbol. For example, 0th and 1st (i=0, 1) symbols correspond to parity symbols, and the rest (i=2 to n−1) of the symbols correspond to information symbols. The subscript j (0≤j<m) represents the ordinal position of the bit in the symbol.

The numerical value L calculated by L=min ($n_{max}$, n+m−1) is used in the following description.

Next, data used in the first-dimensional SISO decoding will be described. Hereinafter, data used in the first-dimensional SISO decoding is referred to as first-dimensional data. As described below, the first-dimensional data includes a plurality of types of data.

Figure 15:
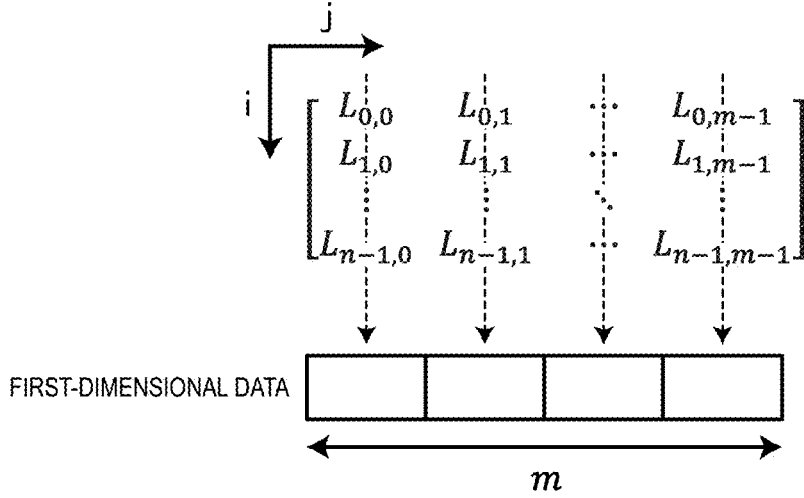
FIG. 15 is a diagram showing a calculation procedure of first-dimensional data.

FIG. 15 is a diagram showing a calculation procedure of first-dimensional data. $L_{i,\,j}$ represents the LLR of the j-th bit of the i-th symbol provided in the RS frame. The number of elements of the first-dimensional data is m. The dashed arrow represents a direction in which data is reduced when the first-dimensional data is calculated. In the following, this direction may be referred to as a first-dimensional direction.

The first-dimensional data includes, for example, the following three types of data.

Figures 16, 17:
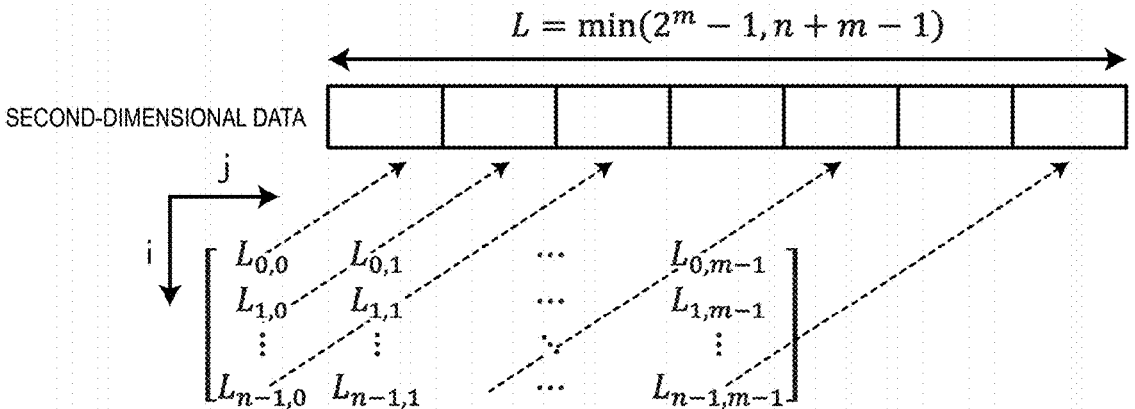
FIG. 16 is a diagram summarizing notation, elements, and calculation formula of data.
FIG. 17 is a diagram showing a calculation procedure of second-dimensional data.

First-dimensional XOR data
First-dimensional min1 data
First-dimensional min2 data FIG. 16 is a diagram summarizing the notation, the number of elements, and the calculation formula of these three pieces of data. Hereinafter, each processing will be described using these notations.

$h(L_{i,j})$ represents a hard decision value of $L_{i,j}$. That is, when $L_{i,j} \leq 0$, h ($L_{i,j}$)=0, and when $L_{i,j} \leq 0$, h ($L_{i,j}$)=1. $|L_{i,j}|$ represents an absolute value of $L_{i,j}$. min represents a symbol that takes a minimum value. In the present embodiment, smin is used as a symbol taking a second smallest value.

The SISO decoding unit 182 uses the input LLR ($L_{i,j}$), the first-dimensional XOR data x, the first-dimensional min1 data y, and the first-dimensional min2 data z to calculate first-dimensional extrinsic LLR data $L_{i,j}^{(e1)}$ according to the following Equation (7).

Equation 7

$$L_{i,j}^{(e1)} = c(-1)^{s_{i,j}} t_{i,j}, \tag{7}$$

$$s_{i,j} = x_j \oplus h(L_{i,j}),$$

$$t_{i,j} = \begin{cases} y_j \ldots \text{when } |L_{i,j}| \neq y_j \\ z_j \ldots \text{other than } |L_{i,j}| \neq y_j \end{cases}$$

$s_{i,j}$ corresponds to a value obtained by subtracting the contribution of LLR ($L_{i,j}$) from the value x at the position j of the first-dimensional XOR data. $t_{i,j}$ corresponds to a minimum value among values obtained by subtracting $L_{i,j}$ from the absolute values of LLRs ($L_{0,j}$, $L_{1,j}$, . . . , and $L_{n-1,j}$) related to the position j. c represents a scale factor in the first dimension (hereinafter, referred to as a first-dimensional scale factor).

Next, data used in the second-dimensional SISO decoding will be described. Hereinafter, data used in the second-dimensional SISO decoding is referred to as second-dimensional data. The second-dimensional data includes a plurality of types of data.

FIG. 17 is a diagram showing a calculation procedure of second-dimensional data. The number of elements of the second-dimensional data is L=min($2^m$−1, n+m−1). When $n_{max}=2^m-1$ is used, the number of elements L corresponds to the above L=min($n_{max}$, n+m−1). The dashed arrow represents a direction in which data is reduced when the second-dimensional data is calculated. In the following, this direction may be referred to as a second-dimensional direction.

The second-dimensional data includes, for example, the following three types of data.

Second-dimensional XOR data

Second-dimensional min1 data

Second-dimensional min2 data

FIG. 18 is a diagram summarizing the notations, the number of elements, and the calculation formula of these three pieces of data. Hereinafter, each processing will be described using these notations.

The expression "i+j=1 (mod $2^m$−1)" written below the symbols in the calculation formula (exclusive OR, min, and smin) means "taking a combination of (i,j), such that the remainder obtained by dividing i+j by $2^m$−1 is 1".

The SISO decoding unit 182 uses the input LLR ($L_{i,j}$), the second-dimensional XOR data x', the second-dimensional min1 data y', and the second-dimensional min2 data z' to calculate second-dimensional extrinsic LLR data $L_{i,j}^{(e2)}$ according to the following Equation (8).

Equation 8

$$L_{i,j}^{(e2)} = c'(-1)^{s'_{i,j}} t'_{i,j},$$ (8)

$$s'_{i,j} = x'_l \oplus h(L_{i,j}),$$

$$t'_{i,j} = \begin{cases} y'_l \dots \text{when } |L_{i,j}| \neq y'_l \\ z'_l \dots \text{other than } |L_{i,j}| \neq y'_l \end{cases}$$

$$l \equiv i + j \,(\text{mod}\, 2^m - 1)$$

$s'_{i,j}$ corresponds to a value obtained by subtracting the contribution of LLR ($L_{i,j}$) from the value $x'_l$ at the position l of the second-dimensional XOR data. $t'_{i,j}$ corresponds to a minimum value among values obtained by subtracting $L_{i,j}$ from the absolute values of LLRs related to position l ($L_{1,0}$, $L_{l-1,1}$, $L_{l-2,2}$, . . . ). c' represents a scale factor in the second dimension (hereinafter, referred to as a second-dimensional scale factor).

Figure 19:
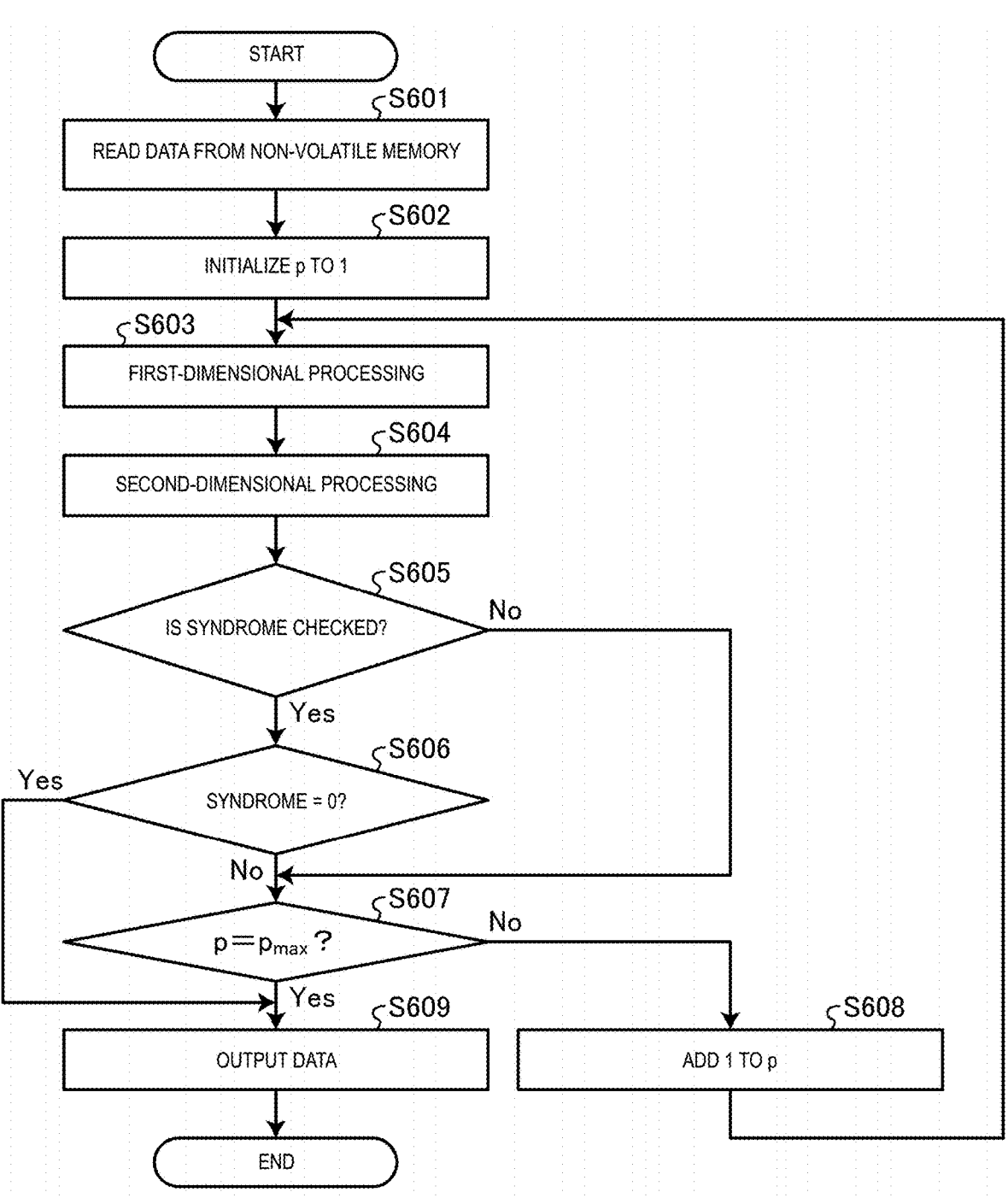
FIG. 19 is a flowchart of decoding processing by the memory system according to a second embodiment.

Next, a flow of decoding processing by the memory system 1 according to the second embodiment will be described. FIG. 19 is a flowchart showing an example of decoding processing by the memory system of a second embodiment.

The control unit 11 reads the error-correction code from the non-volatile memory 20 and obtains the read information (step S601).

The SISO decoding unit 182 initializes an index p indicating the number of iterations to 1 (step S602). The SISO decoding unit 182 executes first-dimensional processing corresponding to the SISO decoding of the SPC code (step S603). The SISO decoding unit 182 executes second-dimensional processing corresponding to the SISO decoding of the Hamming code (step S604). The details of the first-dimensional processing and the second-dimensional processing will be described below.

The SISO decoding unit 182 determines whether to execute checking of the syndrome (step S605). For example, the SISO decoding unit 182 makes a determination by referring to a setting value indicating whether to check the syndrome. The setting value may, for example, be externally configurable.

When the syndrome is to be checked (step S605: Yes), the SISO decoding unit 182 determines whether the syndrome is 0 (step S606). The SISO decoding unit 182, for example, calculates the syndrome from the hard decision value of a posteriori LLR and determines whether the calculated syndrome is 0.

When the syndrome is not 0 (step S606: No) and it is determined in step S605 that the syndrome is not checked (step S605: No), the SISO decoding unit 182 determines whether the index p is equal to a predetermined maximum value $p_{max}$ (step S607).

When the index p is not equal to the maximum value $p_{max}$ (step S607: No), the SISO decoding unit 182 adds 1 to the index p (step S608), and the process returns to step S603 to repeat the processing.

When the index p is equal to the maximum value $p_{max}$ (step S607: Yes) and when it is determined in step S606 that the syndrome is 0 (step S606: Yes), the SISO decoding unit 182 outputs the data of the processing result (step S609) and ends the decoding processing.

Next, the details of the first-dimensional processing and the second-dimensional processing will be described. Here, the definitions of various data used in the description will be described. FIG. 20 is a diagram summarizing names, notations, and the number of elements of a plurality of data used in the following description.

Each data will be described below.

Channel LLR data: Data obtained by converting read information read from the non-volatile memory 20 into a sequence of LLR (LLR data input to the decoder 18)

LLR data 1: Data used to create second-dimensional data in first-dimensional processing. The first iteration is equal to the channel LLR data, and the second or later iterations are equal to data obtained by adding the second-dimensional extrinsic LLR data to the channel LLR data.

First-dimensional XOR data: Data obtained by taking an exclusive OR in a first-dimensional direction using a hard decision value of the LLR data 1.

First-dimensional min1 data: Data obtained by taking a minimum value in the first-dimensional direction using an absolute value of the LLR data 1.

First-dimensional min2 data: Data obtained by taking a second smallest value in the first-dimensional direction using an absolute value of the LLR data 1.

First-dimensional extrinsic LLR data: Extrinsic LLR for each bit obtained by the first-dimensional processing. The first-dimensional extrinsic LLR data is calculated from the first-dimensional XOR data, the first-dimensional min1 data, and the first-dimensional min2 data.

LLR data 2: Data used to create second-dimensional data in second-dimensional processing. The LLR data 2 is equal to data obtained by adding the first-dimensional extrinsic LLR data to the channel LLR data.

Second-dimensional XOR data: Data obtained by taking an exclusive OR in a second-dimensional direction using a hard decision value of the LLR data 2.

Second-dimensional min1 data: Data obtained by taking a minimum value in the second-dimensional direction using an absolute value of the LLR data 2.

Second-dimensional min2 data: Data obtained by taking a second smallest value in the second-dimensional direction using an absolute value of the LLR data 2.

Hamming code input LLR data: Data calculated from the second-dimensional XOR data and the second-dimensional min1 data.

Hamming code extrinsic LLR data: Extrinsic LLR data obtained by executing SISO decoding of a Hamming code using the Hamming code input LLR data. The Hamming code extrinsic LLR data is used for updating of the second-dimensional XOR data, the second-dimensional min1 data, and the second-dimensional min2 data.

Second-dimensional extrinsic LLR data: Extrinsic LLR for each bit obtained by the second-dimensional processing. The second-dimensional extrinsic LLR data is calculated from the second dimension XOR data, the second-dimensional min1 data, and the second-dimensional min2 data.

A posteriori LLR data: a posteriori LLR for each bit obtained as a result of decoding processing. The a posteriori value LLR data is equal to data obtained by adding the first-dimensional extrinsic LLR data and the second-dimensional extrinsic LLR data to the channel LLR data.

Figure 21:
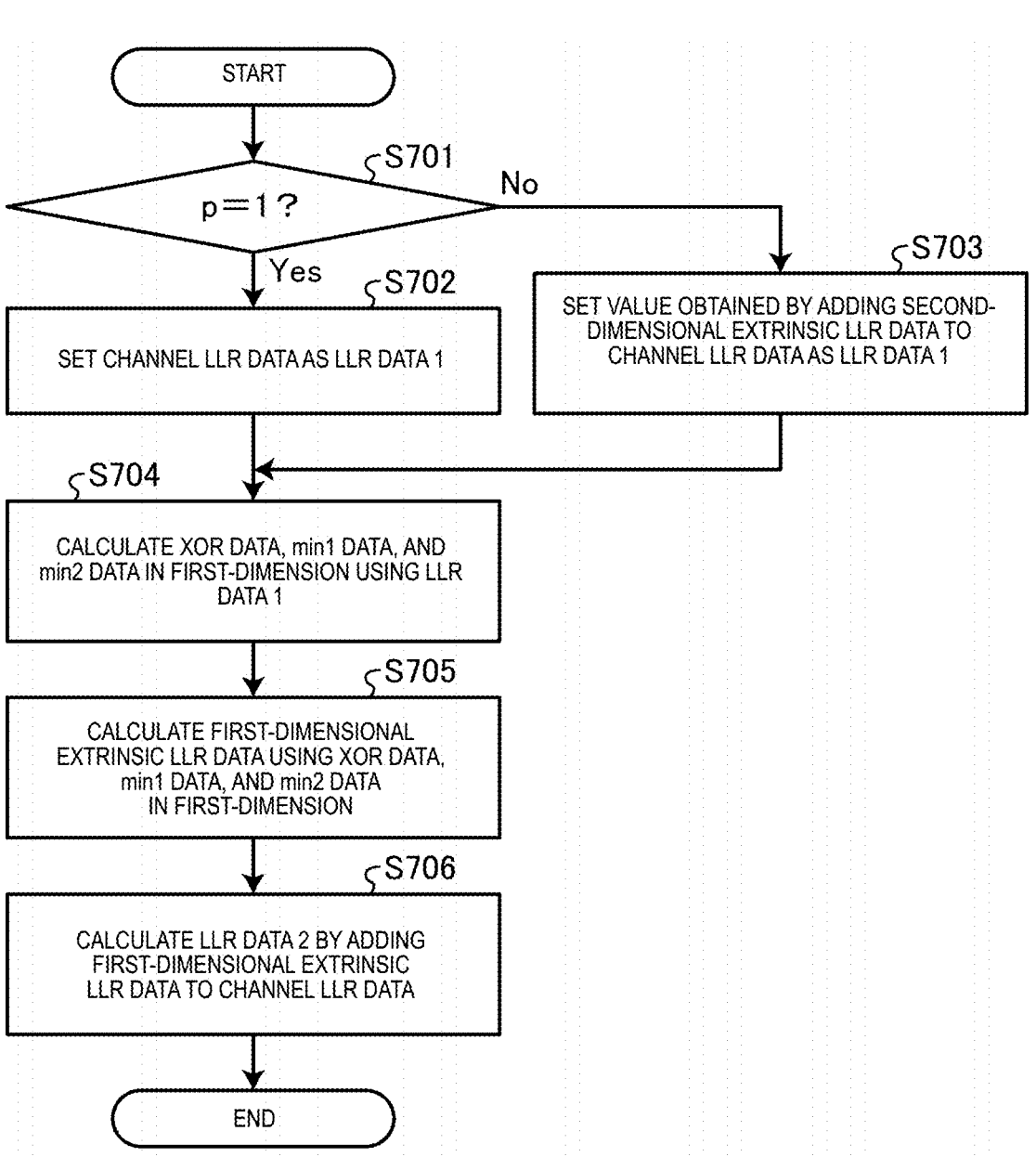
FIG. 21 is a flowchart of first-dimensional processing.

Next, the first-dimensional processing will be described. FIG. 21 is a flowchart showing an example of the first-dimensional processing.

The SISO decoding unit 182 determines whether the index p is equal to 1 (step S701). When the index p is equal to 1 (step S701: Yes), the SISO decoding unit 182 sets the channel LLR data as the LLR data 1 as shown in the following Equation (9) (step S702).

Equation 9

$$L_{i,j}^{(1)} = L_{ij}^{(c)} \quad (0 \le i < n, 0 \le j < m) \tag{9}$$

When the index p is not equal to 1 (step S701: No), the SISO decoding unit 182 sets a value obtained by adding the second-dimensional extrinsic LLR data to the channel LLR data as LLR data 1, as shown in the following Equation (10) (step S703).

Equation 10

$$L_{i,j}^{(1)} = L_{i,j}^{(c)} + L_{i,j}^{(e2)} \quad (0 \le i < n, 0 \le 1 < m) \tag{10}$$

The SISO decoding unit 182 calculates first-dimensional XOR data, first-dimensional min1 data, and first-dimensional min2 data using the LLR data 1 (step S704). For example, the SISO decoding unit 182 calculates these data according to the procedure described with reference to FIGS. 15 and 16.

The SISO decoding unit 182 calculates the first-dimensional extrinsic LLR data using the calculated first-dimensional XOR data, first-dimensional min1 data, and first-dimensional min2 data, for example, according to the Equation (7) described above (step S705).

The SISO decoding unit 182 calculates the LLR data 2 by adding the first-dimensional extrinsic LLR data to the channel LLR data, as shown in the following Equation (11) (step S706), and ends the first-dimensional processing.

Equation 11

$$L_{i,j}^{(2)} = L_{i,j}^{(c)} + L_{i,j}^{(e1)} \quad (0 \le i < n, 0 \le j < m) \tag{11}$$

Next, the second-dimensional processing will be described. FIG. 22 is a flowchart showing an example of second-dimensional processing.

The SISO decoding unit 182 calculates second-dimensional XOR data, second-dimensional min1 data, and second-dimensional min2 data using the LLR data 2 (step S801). For example, the SISO decoding unit 182 calculates these data according to the procedure described with reference to FIGS. 17 and 18.

The SISO decoding unit 182 calculates the Hamming code input LLR data using the calculated second-dimensional XOR data and second-dimensional min1 data, for example, according to the following Equation (12) (step S802).

Equation 12

$$L_l^{(ih)} = (-1)^{x'_l} y'_l \quad (0 \le l < L) \tag{12}$$

The SISO decoding unit 182 executes SISO decoding of the Hamming code and calculates the Hamming code extrinsic LLR data (step S803). The SISO decoding of the Hamming code is executed, for example, by the same procedure as in the first embodiment.

The SISO decoding unit 182 updates the second-dimensional XOR data, the second-dimensional min1 data, and the second-dimensional min2 data using the Hamming code extrinsic LLR data (step S804). The SISO decoding unit 182 updates the second-dimensional XOR data, for example, according to the following Equation (13).

Equation 13

$$x'_l = x'_l \oplus h(L_l^{(eh)}) \tag{13}$$

The SISO decoding unit 182 updates the second-dimensional min1 data and the second-dimensional min2 data according to the following procedure.

When $|L_l^{(eh)}| < y'_l$, first, $z'_l$ is updated with $y'_l$, and then $y'_l$ is updated with $|L_l^{(eh)}| < y'_l$.

When $y'_l \le |L_l^{(eh)}| < z'_l$, $z'_l$ update with $|L_{l(eh)}|$.

When $z'_l < |L_l^{(eh)}|$, the update is not executed.

The SISO decoding unit 182 calculates the second-dimensional extrinsic LLR data using the second-dimensional XOR data, the second-dimensional min1 data, and the second-dimensional min2 data, for example, according to the Equation (8) described above (step S805).

The SISO decoding unit 182 calculates the a posteriori LLR data by adding the second-dimensional extrinsic LLR data to the LLR data 2, for example, as in the following Equation (14) (step S806).

Equation 14

$$L_{i,j}^{(a)} = L_{i,j}^{(2)} + L_{i,j}^{(e2)} \quad (0 \le i < n, 0 \le j < m) \tag{14}$$

Next, an example of the data output processing in step S609 will be described. The data to be output may be, for example, a posteriori LLR or a hard decision value (decoded word) of the a posteriori LLR.

The a posteriori LLR may be represented in the form of, for example, the following Equation (15). The method of outputting the a posteriori LLR corresponds to a use case in which, for example, not only the hard decision value (0 or 1) of each bit, but also probability information is desired to be output.

Equation 15

$$L_{i,j}^{(a)} = L_{i,j}^{(c)} + L_{i,j}^{(e1)} + L_{i,j}^{(e2)} \quad (0 \leq i < n, 0 \leq j < m) \tag{15}$$

The hard decision value of the a posteriori LLR may be represented in the form of, for example, the following Equation (16). A method of outputting the hard decision value of the a posteriori LLR corresponds to a use case in which, for example, it is sufficient to output the hard decision value (0 or 1) of each bit.

Equation 16

$$h\!\left(L_{i,j}^{(a)}\right) \quad (0 \leq i < n, 0 \leq j < m) \tag{16}$$

As described above, according to the second embodiment, the same method as in the first embodiment is applied to the decoding of the Hamming code included as an internal structure in the RS code. Thereby, it is possible to reduce the amount of calculation for decoding the RS code.

Third Embodiment

In the third embodiment, a decoding method (turbo decoding) is used in which SISO decoding is repeatedly executed for a concatenated code of the RS code of the second embodiment and a code CA (first code) different from the RS code. The same method as in the second embodiment is applied to the decoding of the RS code provided in the concatenated code.

Figure 23:
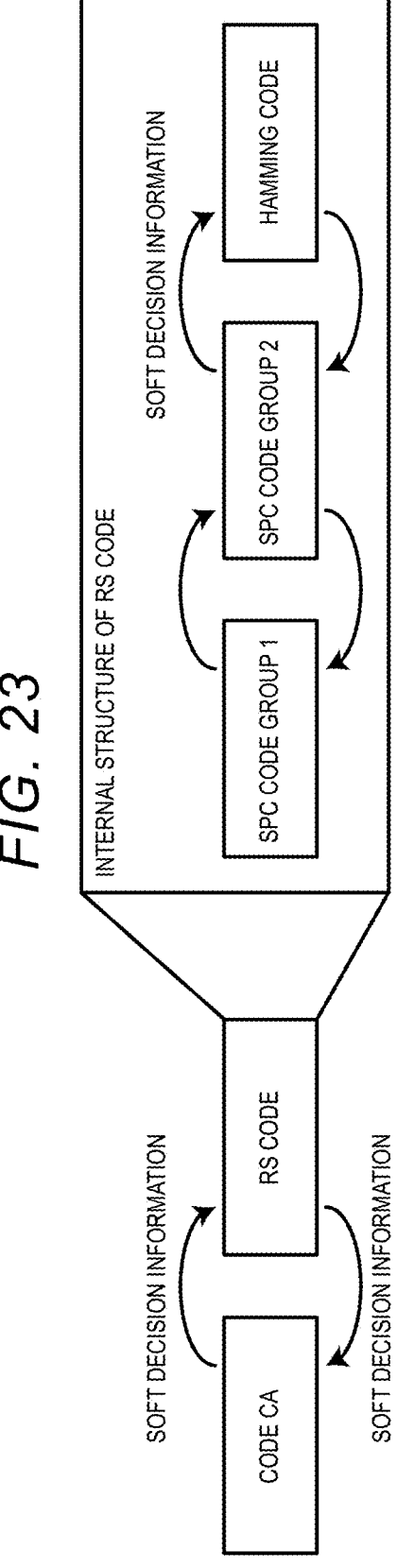
FIG. 23 is a conceptual diagram showing a decoding method according to a third embodiment.

FIG. 23 is a conceptual diagram showing a decoding method according to a third embodiment. As shown in FIG. 23, in the present embodiment, the soft decision information obtained by SISO decoding with the code CA and the soft decision information obtained by SISO decoding with the RS code are exchanged with each other, and the decoding is repeated. The RS code includes a plurality of SPC code groups and a Hamming code as an internal structure. The code CA may be any code, and is, for example, the following codes.

Generalized Low Density Parity Check Code (Generalized LDPC Code)

Bose-Chandhuri-Hocquenghem (BCH) code

Multi-dimensional error-correction code (such as product code) in which a symbol is protected by a plurality of smaller component codes.

Figure 24:
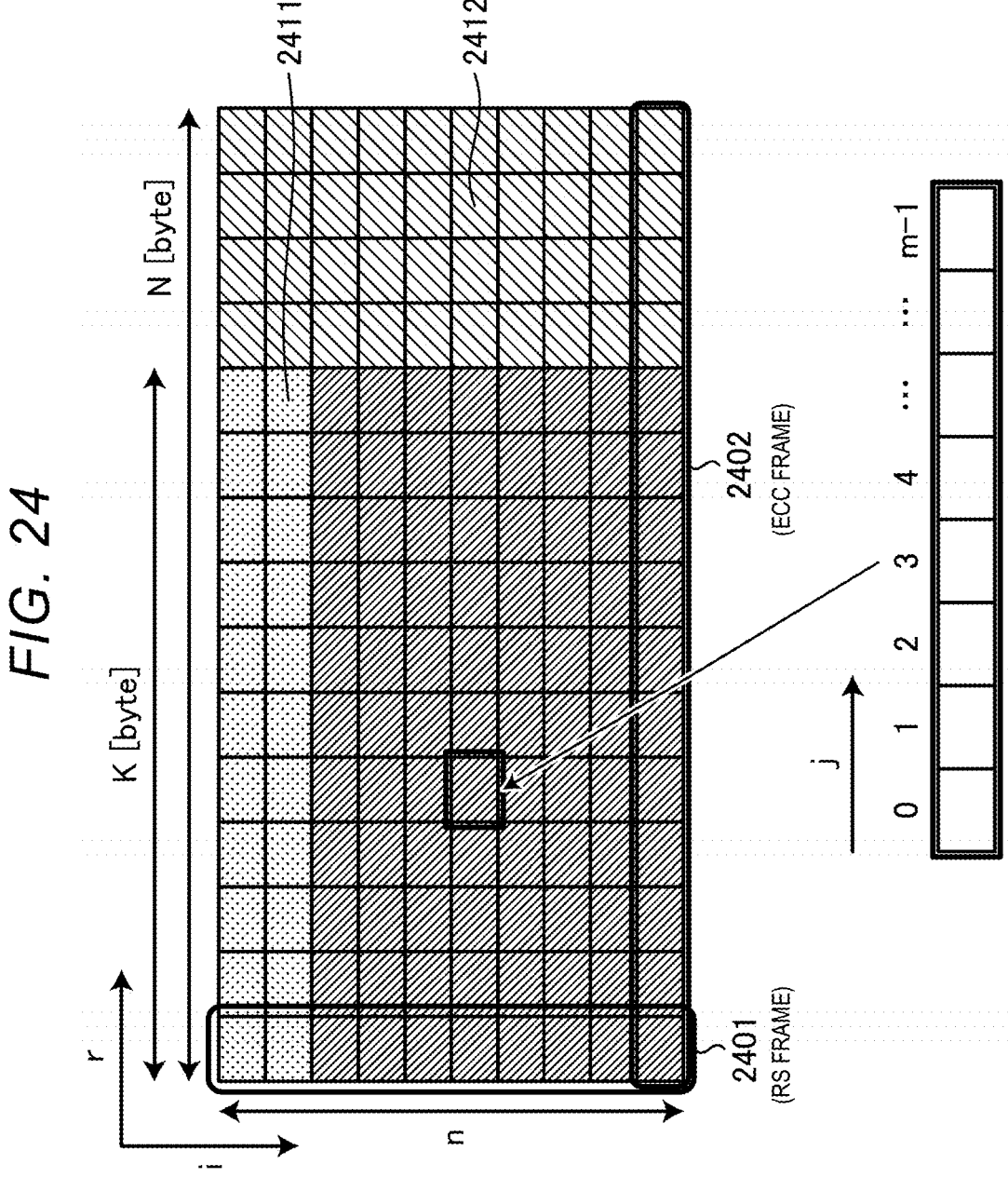
FIG. 24 is a diagram showing an example of a code used in the third embodiment.

First, the code (concatenated code) used in the present embodiment will be described. FIG. 24 is a diagram showing an example of a code used in the third embodiment. As shown in FIG. 24, the code of the present embodiment includes a plurality of RS frames and a plurality of error correcting code (ECC) frames.

The RS frame corresponds to an RS code on a Galois field GF($2^m$). In the present embodiment, a size of one symbol is m bits. In the following, the m bits are set to 1 byte. The RS frame is an RS code with a code length n (bytes), an information length (n−2) (bytes), and a parity length 2 (bytes). A portion corresponding to the parity length 2 corresponds to the RS parity 2411. The roots are set to be two, 1 and α. α is a primitive element on GF($2^m$).

The ECC frame is a code with a code length N (bytes) and an information length K (bytes) (K is a natural number smaller than N). The portion corresponding to the difference between the code length N and the information amount K corresponds to the ECC parity 2412.

In the example of FIG. 24, the range corresponding to the information length K of the ECC frame is protected by K RS frames. The range protected by the RS frame does not need to be K (bytes), and may be shorter or longer than K (bytes).

The entire RS frame described with reference to FIG. 14 corresponds to one RS frame (for example, the RS frame 2401). That is, in FIG. 24, one cell represents m bits (=1 byte). The subscript i (0≤i<n) represents the ordinal position of the ECC frame. Hereinafter, for convenience of description, the ECC frame to be corrected is set to i=n−1. In FIG. 24, the ECC frame 2402 corresponds to the (n−1)-th ECC frame. The subscript r (0≤r<N) represents the ordinal position of the RS frame. The subscript j (0≤j<m) represents the ordinal position of the bit in the symbol (byte). As described above, compared to the second embodiment, in the present embodiment, a subscript r representing the ordinal position of the RS frame is added.

FIG. 25 is a diagram summarizing names, notations, and the number of elements of a plurality of data used in the third embodiment.

Each types of data will be described below.

LLR data 1: Data used when creating first-dimensional data in first-dimensional processing. In the present embodiment, LLR data 1 is equal to the read information read from the non-volatile memory 20 which is data converted into a sequence of LLR, that is, equal to the channel LLR data.

Decoded word data: Data obtained when soft bit decoding (SB decoding) of the ECC frame is successful.

First-dimensional XOR data: Data obtained by taking an exclusive OR in a first-dimensional direction for all the hard decision values of the ECC frames. The hard decision value represents the decoded word data in the ECC frame in which the decoding is successful (hereinafter, referred to as a decoding success ECC frame), and represents the hard decision value of the LLR data 1 in the ECC frame in which the decoding fails (hereinafter, referred to as a decoding failed ECC frame).

First-dimensional min1 data: Data obtained by taking a minimum value in the first-dimensional direction for the absolute value of the LLR data 1 of the decoding failed ECC frame.

First-dimensional min2 data: Data obtained by taking a second smallest value in the first-dimensional direction for the absolute value of the LLR data 1 of the decoding failed ECC frame.

First-dimensional extrinsic LLR data: Extrinsic LLR for each bit obtained by the first-dimensional processing.

LLR data 2: Data used to create second-dimensional data in second-dimensional processing. The LLR data 2 is equal to data obtained by adding the first-dimensional extrinsic LLR data to the channel LLR data.

Second-dimensional XOR data: Data obtained by taking an exclusive OR in a second-dimensional direction for all the "hard decision values" of the ECC frames. The "hard decision value" represents the decoded word data in the decoding success ECC frame, and the hard decision value of the LLR data2 in the decoding failed ECC frame.

Second-dimensional min1 data: Data obtained by taking a minimum value in the second-dimensional direction for the absolute value of the LLR data 2 of the decoding failed ECC frame.

Second-dimensional min2 data: Data obtained by taking a second smallest value in the second-dimensional direction for the absolute value of the LLR data 2 of the decoding failed ECC frame.

Hamming code extrinsic LLR data: Extrinsic LLR data obtained by executing SISO decoding of a Hamming code using Hamming code input LLR data calculated from the second-dimensional XOR data and the second-dimensional min1 data. The Hamming code extrinsic LLR data is used for updating of the second-dimensional XOR data, the second-dimensional min1 data, and the second-dimensional min2 data.

Second-dimensional extrinsic LLR data: Extrinsic LLR for each bit obtained by the second-dimensional processing. The second-dimensional extrinsic LLR data is calculated from the second dimension XOR data, the second-dimensional min1 data, and the second-dimensional min2 data.

LLR data 3: a posteriori LLR for each bit obtained as a result of decoding processing by the RS code. The LLR data 3 is equal to data obtained by adding the first-dimensional extrinsic LLR data and the second-dimensional extrinsic LLR data to the channel LLR data.

As described above, when the minimum value or the second minimum value is taken, the decoding failed ECC frame is targeted, and the decoding success ECC frame is not targeted. This is because a decoded word is obtained in the decoding success ECC frame, and all bits are considered as highly reliable, and thus it is not necessary to consider at the calculation of the minimum value or the second minimum value.

The f used in the calculation of the number of elements in FIG. 25 represents the number of decoding failed ECC frames. Since there is no need to execute the decoding processing of the ECC frame again in the decoding success ECC frame, only the data corresponding to the decoding failed ECC frames needs to be prepared. The data, in which the number of elements is calculated using the number f of the decoding failed ECC frames in FIG. 25, corresponds to such data.

In addition, the subscript l ($0 \leq l < L$) used in the notation of FIG. 25 represents the ordinal position of the data in the second-dimensional direction of the RS frame.

Figure 26:
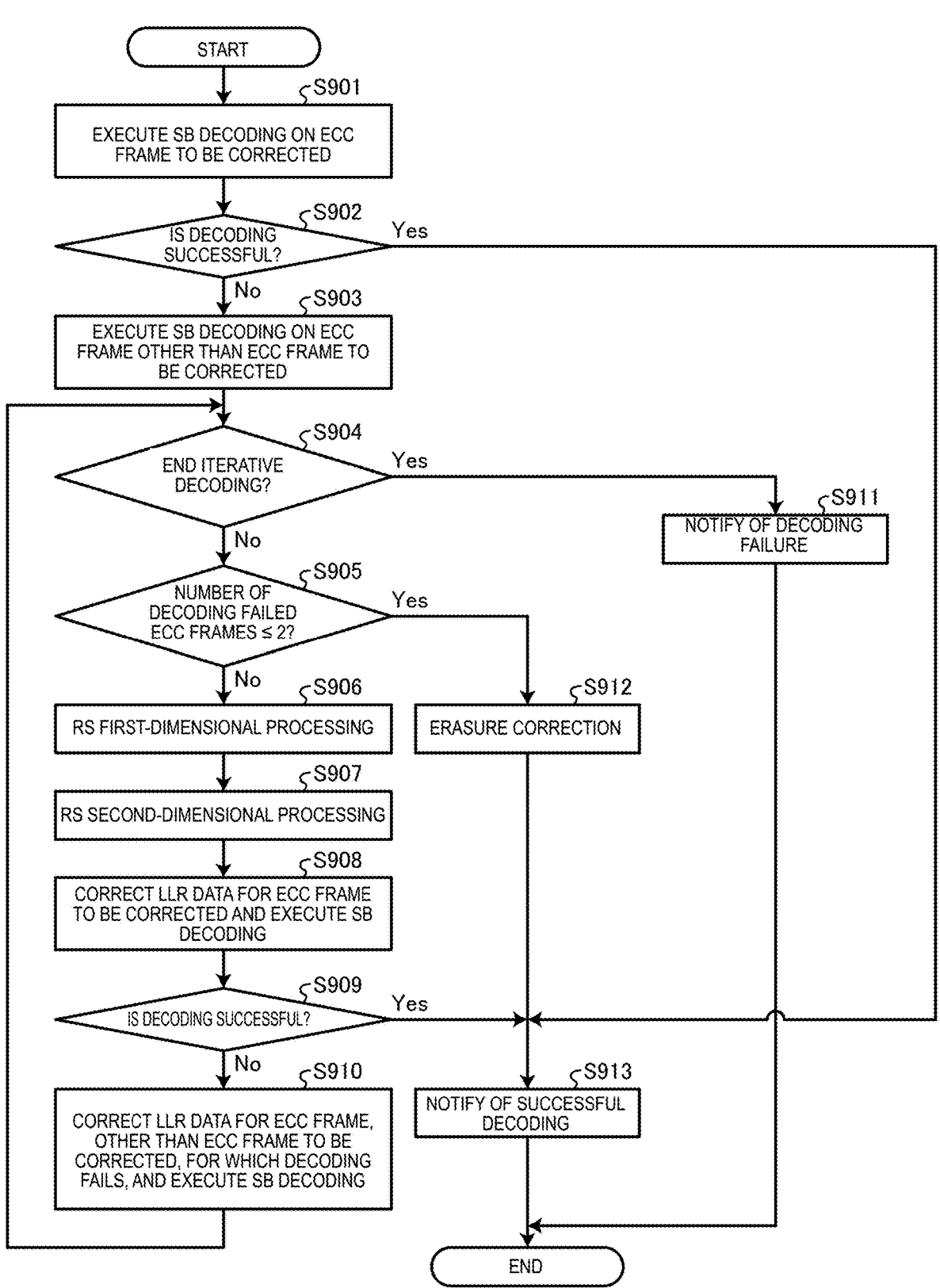
FIG. 26 is a flowchart of decoding processing by the memory system according to the third embodiment.

Next, a flow of decoding processing by the memory system 1 according to the third embodiment will be described. FIG. 26 is a flowchart showing an example of decoding processing by the memory system of the third embodiment.

The decoding processing according to the present embodiment is mainly divided into the following three processing. The details of the three processing will be described with reference to FIGS. 27 to 30.

Decoding Processing (First Time) for ECC Frame: Step S901 to Step S903

Decoding Processing for RS Frame: Step S906 and Step S907

Decoding processing for ECC frame (other than the first time): Step S908 to Step S910

The SISO decoding unit 182 executes soft bit decoding (SB decoding) on the ECC frame to be corrected (step S901). The SB decoding is, for example, SISO decoding that inputs a soft decision input value and outputs a soft decision output value.

The SISO decoding unit 182 determines whether the decoding is successful (step S902). When the decoding is not successful (step S902: No), the SISO decoding unit 182 executes the SB decoding on the ECC frame other than the ECC frame to be corrected (step S903).

The SISO decoding unit 182 determines whether to end the iterative decoding (step S904). For example, the SISO decoding unit 182 determines to end the iterative decoding when the following conditions are satisfied.

The number of iterations reaches a predetermined number

The number of decoding failed ECC frames is greater than a threshold value (EF threshold value)

The number of decoding failed ECC frames is not reduced since the previous iteration.

When the iterative decoding is not ended (step S904: No), the SISO decoding unit 182 determines whether the number of the decoding failed ECC frames is equal to or less than 2 (step S905). When the number of the decoding failed ECC frames is not equal to or less than 2 (step S905: No), the SISO decoding unit 182 executes RS first-dimensional processing (step S906) and RS second-dimensional processing (step S907). The RS first-dimensional processing corresponds to the SISO decoding in the first-dimensional direction of the RS code. The RS second-dimensional processing corresponds to the SISO decoding in the second-dimensional direction of the RS code.

Subsequently, the SISO decoding unit 182 executes second or later (other than the first time) decoding processing for the ECC frame. That is, the SISO decoding unit 182 corrects the LLR data for the ECC frame to be corrected and executes the SB decoding (step S908).

The SISO decoding unit 182 determines whether the decoding is successful (step S909). When the decoding is not successful (step S909: No), the SISO decoding unit 182 corrects the LLR data for the ECC frame, other than the ECC frame to be corrected, for which the decoding fails, and executes the SB decoding (step S910), and the process returns to step S904 to repeat the processing.

When it is determined in step S904 that the iterative decoding ends (step S904: Yes), the SISO decoding unit 182 notifies an external control unit or the like of the failure of decoding (step S911), and ends the decoding processing.

When it is determined in step S905 that the number of the decoding failed ECC frames is equal to or less than 2 (step S905: Yes), the SISO decoding unit 182 executes erasure correction to correct the error (step S912).

After erase correction, when it is determined that decoding is successful in step S902 (step S902: Yes) and it is determined that decoding is successful in step S909 (step S909: Yes), the SISO decoding unit 182 notifies an external control unit or the like of the success of decoding and the decoded word (step S913), and ends the decoding processing.

Figure 27:
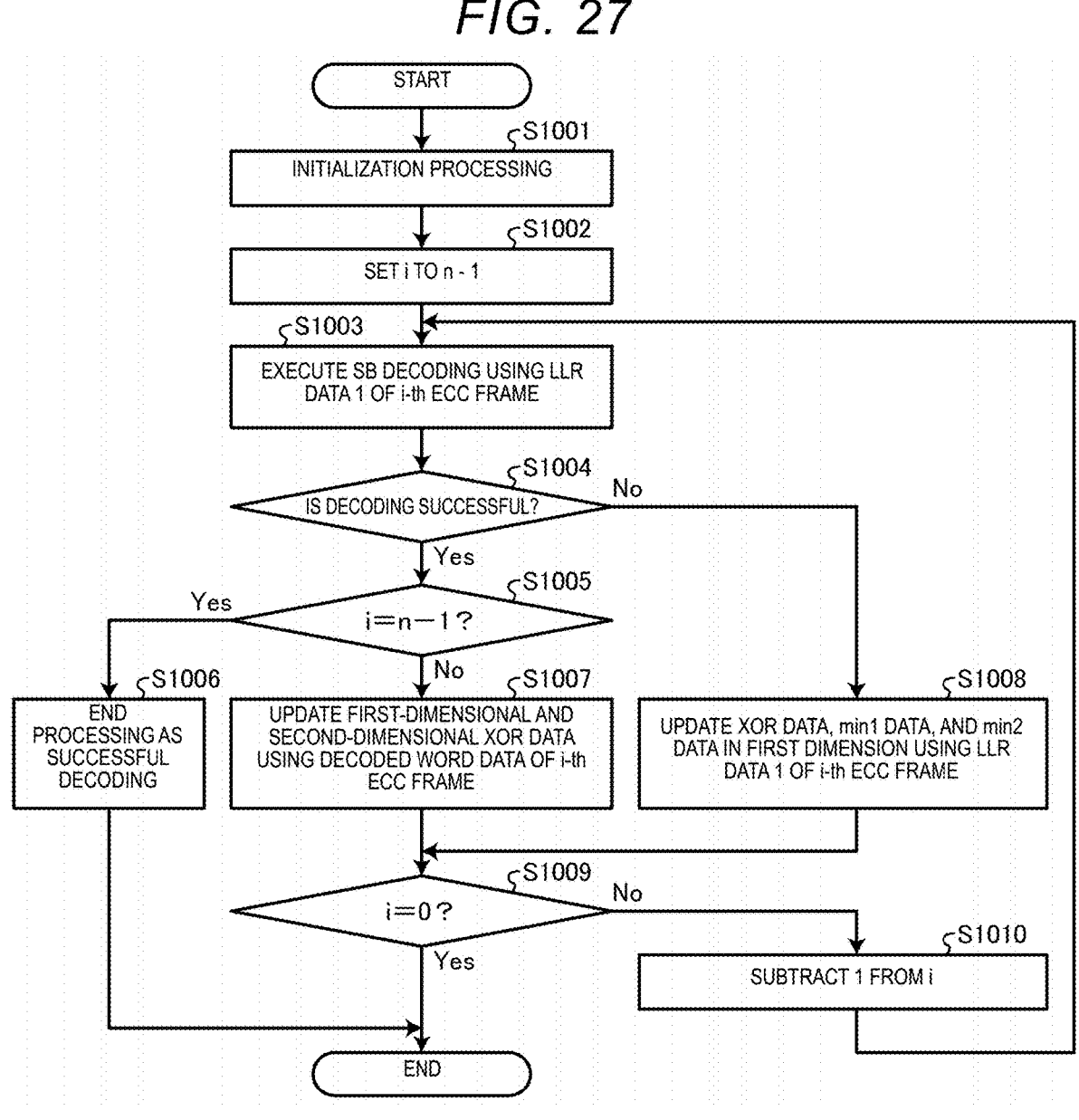
FIG. 27 is a flowchart of decoding processing (first time) for an Error Correction Code (ECC) frame.

Next, the details of the decoding processing (first time) for the ECC frame corresponding to the step S901 to the step S903 in FIG. 26 will be described with reference to FIG. 27. FIG. 27 is a flowchart showing an example of decoding processing (first time) for an ECC frame.

The SISO decoding unit 182 executes initialization processing of each data used for decoding (step S1001). For example, the SISO decoding unit 182 initializes each data as follows.

First-dimensional XOR data and second-dimensional XOR data: All elements are initialized to 0.

First-dimensional min1 data, first-dimensional min2 data, second-dimensional min1 data, and second-dimensional min2 data: All elements are initialized to the maximum value of LLR.

The SISO decoding unit 182 sets i to n−1 (step S1002). The SISO decoding unit 182 executes SB decoding using the LRR data 1 of the i-th ECC frame (step S1003).

The SISO decoding unit 182 determines whether the decoding is successful (step S1004). When the decoding is successful (step S1004: Yes), the SISO decoding unit 182 determines whether i=n−1 is established (step S1005). When i=n−1 (step S1005: Yes), the SISO decoding unit 182 ends the processing as successful decoding (step S1006).

When i=n−1 is not satisfied (step S1005: No), the SISO decoding unit 182 updates the first-dimensional XOR data and the second-dimensional XOR data using the decoded word data for the i-th ECC frame (step S1007).

For example, the SISO decoding unit 182 updates the first-dimensional XOR data $x_{r,j}$ according to the following Equation (17). In addition, the SISO decoding unit 182 updates the second-dimensional XOR data $x'_{r,j}$ according to the following Equation (18).

Equation 17

$$x_{r,j} = x_{r,j} \oplus D_{r,i,j} \tag{17}$$

Equation 18

$$x'_{r,l} = x'_{r,l} \oplus D_{r,i,j} \tag{18}$$

In the Equation (17) and the Equation (18), i is fixed, and r and j take all combinations in the range of $0 \leq r < K$ and $0 \leq j < m$. l is a value that satisfies l=i+j (mod $2^m-1$) as in the Expression (8).

When it is determined in step S1004 that the decoding fails (step S1004: No), the SISO decoding unit 182 updates the first-dimensional XOR data, the first-dimensional min1 data, and the first-dimensional min2 data using the LLR data 1 of the i-th ECC frame (step S1008). For example, the SISO decoding unit 182 updates the first-dimensional XOR data $x_{r,j}$ according to the following Equation (19).

As in the Expression (17) and the Expression (18), i is fixed, and r and j take all combinations in the range of $0 \leq r < K$ and $0 \leq j < m$.

Equation 19

$$x_{r,j} = x_{r,j} \oplus h\big(L^{(1)}_{r,i,j}\big) \tag{19}$$

The SISO decoding unit 182 updates the first-dimensional min1 data $y_{r,j}$ and the first-dimensional min2 data $z_{r,j}$ according to the following procedure. i is fixed, and r and j take all combinations in the range of $0 \leq r < K$ and $0 \leq j < m$.

When $|L_{r,i,j}^{(I)}| < y_{r,j}$, first, $z_{r,j}$ is updated with $y_{r,j}$, and then $y_{r,j}$ is updated with $|L_{r,i,j}^{(I)}|$.

When $y_{r,j} \leq |L_{r,i,j}^{(I)}| < z_{r,j}$, $z_{r,j}$ is updated with $|L_{r,i,j}^{(I)}|$.

When $z_{r,j} < |L_{r,i,j}^{(I)}|$, the update is not executed.

After the step S1007 and the step S1008, the SISO decoding unit 182 determines whether i=0 is established (step S1009). When i is not 0 (step S1009: No), the SISO decoding unit 182 subtracts 1 from i (step S1010), and the process returns to step S1003 to repeat the processing. When i=0 (step S1009: Yes), the SISO decoding unit 182 ends the processing.

In this way, when the decoding is successful (step S1004: Yes), both the first-dimensional data and the second-dimensional data are updated. When the decoding is successful, the min1 data and the min2 data do not need to be updated. In addition, when the decoding fails (step S1004: No), only the first-dimensional data is updated. This is because, the first-dimensional data is calculated using the channel LLR data, but the second-dimensional data is updated using the LLR data 2, that is, data obtained by adding the first-dimensional extrinsic LLR data to the channel LLR data.

Figure 28:
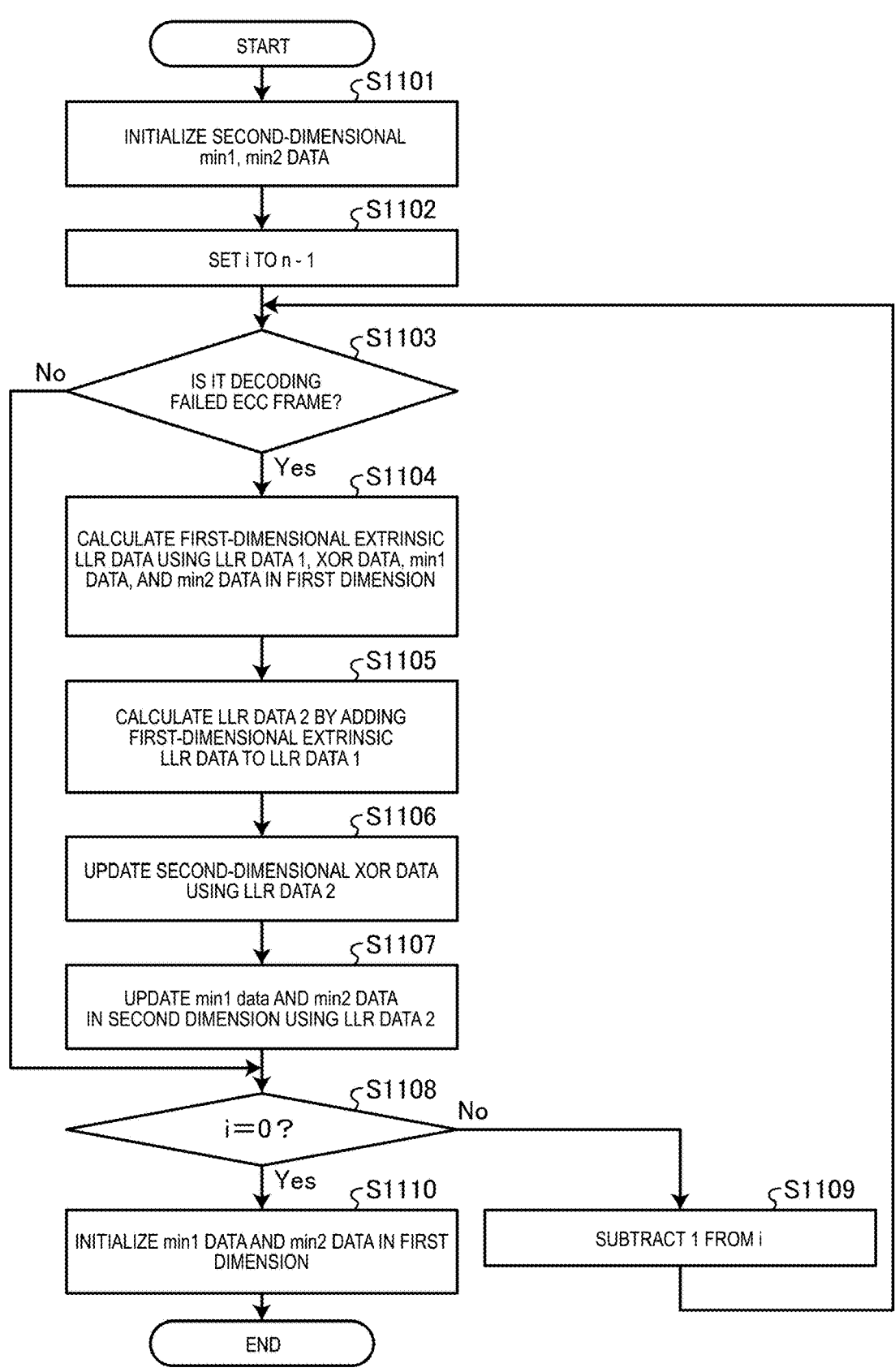
FIG. 28 is a flowchart of RS first-dimensional processing.

Next, the details of the RS first-dimensional processing in step S906 will be described with reference to FIG. 28. FIG. 28 is a flowchart showing an example of RS first-dimensional processing.

The SISO decoding unit 182 initializes the second-dimensional min1 data and the second-dimensional min2 data (step S1101). For example, the SISO decoding unit 182 initializes all elements of the second-dimensional min1 data and the second-dimensional min2 data to the maximum value of the LLR.

The SISO decoding unit 182 sets i to n−1 (step S1102). The SISO decoding unit 182 determines whether the i-th ECC frame is a decoding failed ECC frame (step S1103).

When the i-th ECC frame is the decoding failed ECC frame (step S1103: Yes), the SISO decoding unit 182 calculates the first-dimensional extrinsic LLR data using the LLR data 1, the first-dimensional XOR data, the first-dimensional min1 data, and the first-dimensional min2 data, according to the following Equation (20) (step S1104).

Equation 20

$$L^{(e1)}_{r,i,j} = c(-1)^{s_{r,i,j}} t_{r,i,j}, \tag{20}$$
$$s_{r,i,j} = x_{r,j} \oplus h(l_{r,i,j}),$$
$$t_{r,i,j} = \begin{cases} y_{r,j}\ldots \text{ when } \big|L^{(1)}_{r,i,j}\big| \neq y_{r,j} \\ z_{r,j}\ldots \text{ other than} |L^{(1)}_{r,i,j}| \neq y_{r,j} \end{cases}$$

The Equation (20) differs from the Equation (7) used in the second embodiment in that the subscript r is added.

The SISO decoding unit 182 calculates the LLR data 2 by adding the first-dimensional extrinsic LLR data to the LLR data 1, as shown in the following Equation (21) (step S1105). i is fixed, and r and j take all combinations in the range of $0 \leq r < K$ and $0 \leq j < m$.

Equation 21

$$L^{(2)}_{r,i,j} = L^{(1)}_{r,i,j} + L^{(e1)}_{r,i,j} \tag{21}$$

The SISO decoding unit 182 updates the second-dimensional XOR data using the LLR data 2, as shown in the following Equation (22) (step S1106). i is fixed, and r and j take all combinations in the range of $0 \leq r < K$ and $0 \leq j < m$. l is a value that satisfies l=i+j (mod $2^m-1$).

Equation 22

$$x'_{r,l} = x'_{r,l} \oplus h\big(L^{(2)}_{r,i,j}\big) \tag{22}$$

The SISO decoding unit 182 updates the second dimension min1 data $y'_{r,j}$ and the second dimension min2 data $z'_{r,j}$ using the LLR data 2 according to the following procedure (step S1107). i is fixed, and r and j take all combinations in the range of $0 \leq r < K$ and $0 \leq j < m$. l is a value that satisfies $l \equiv i + j$ (mod $2^m - 1$).

When $|L_{r,i,j}^{(2)}| < y'_{r,l}$, first, $z'_{r,l}$ is updated with $y'_{r,l}$, and then $y'_{r,l}$ is updated with $|L_{r,i,j(2)}|$.

When $y'_{r,l} \leq |L_{r,i,j}^{(2)} < z'_{r,l}$, $z'_{r,l}$ is updated with $|L_{r,i,j}^{(2)}|$.

When $z'_{r,l} < |L_{r,i,j}^{(2)}|$, the update is not executed. After the step S1107, and when it is determined in the step S1103 that the ECC frame is not the decoding failed ECC frame (step S1103: No), the SISO decoding unit 182 determines whether i=0 is established (step S1108). When i is not 0 (step S1108: No), the SISO decoding unit 182 subtracts 1 from i (step S1109), and the process returns to step S1103 to repeat the processing.

When i=0 (step S1108: Yes), the SISO decoding unit 182 initializes the first-dimensional min1 data and the first-dimensional min2 data for the next iteration processing (step S1110), and ends the RS first-dimensional processing. For example, the SISO decoding unit 182 initializes all elements of the first-dimensional min1 data and the first-dimensional min2 data to the maximum value of the LLR. Since the first-dimensional XOR data and the second-dimensional XOR data are updated each time a difference occurs, there is no need to initialize the first-dimensional XOR data and the second-dimensional XOR data for each iteration.

Next, the details of the RS second-dimensional processing in step S907 will be described with reference to FIG. 29. FIG. 29 is a flowchart showing an example of RS second-dimensional processing.

The SISO decoding unit 182 initializes r to 0 (step S1201). The SISO decoding unit 182 calculates the Hamming code input LLR data for the r-th RS frame using the second-dimensional XOR data and the second-dimensional min1 data, according to the following Equation (23) (step S1202)

Equation 23

$$\left( L_{r,l}^{(ih)} \right) = (-1)^{x'_{r,l}} y'_{r,l} \tag{23}$$

The SISO decoding unit 182 executes SISO decoding of the Hamming code on the r-th RS frame and calculates the Hamming code extrinsic value LRR data (step S1203). The SISO decoding of the Hamming code is executed, for example, by the same procedure as in the first embodiment.

The SISO decoding unit 182 updates the second-dimensional XOR data, the second-dimensional min1 data, and the second-dimensional min2 data using the Hamming code extrinsic LLR data for the r-th RS frame (step S1204).

The SISO decoding unit 182 updates the second-dimensional XOR data, for example, according to the following Equation (24). r is fixed, and l satisfies $0 \leq l < L$.

Equation 24

$$x'_{r,l} = x'_{r,l} \oplus h\left( L_{r,l}^{(eh)} \right) \tag{24}$$

The SISO decoding unit 182 updates the second-dimensional min1 data y'r, and the second-dimensional min2 data z'$_{r,j}$ according to the following procedure. r is fixed, and l satisfies $0 \leq l < L$.

When $|L_{r,l}^{(eh)} < y'_{r,l}$, first, $z'_{r,l}$ is updated with $y'_{r,l}$, and then $y'_{r,l}$ is updated with $|L_{r,l}^{(eh)}|$.

When $y'_{r,l} \leq |L_{r,l}^{(eh)} < z'_{r,l}$, $z'_{r,l}$ is updated with $|L_{r,l}^{(eh)}|$ When $z'_{r,l} < |L_{r,l}^{(eh)}|$, the update is not executed.

The SISO decoding unit 182 determines whether r=K−1 is established (step S1205). When r=K−1 is not satisfied (step S1205: No), the SISO decoding unit 182 adds 1 to r (step S1206), and the process returns to step S1202 to repeat the processing.

When r=K−1 (step S1205: Yes), the SISO decoding unit 182 ends the RS second-dimensional processing.

Figure 30:
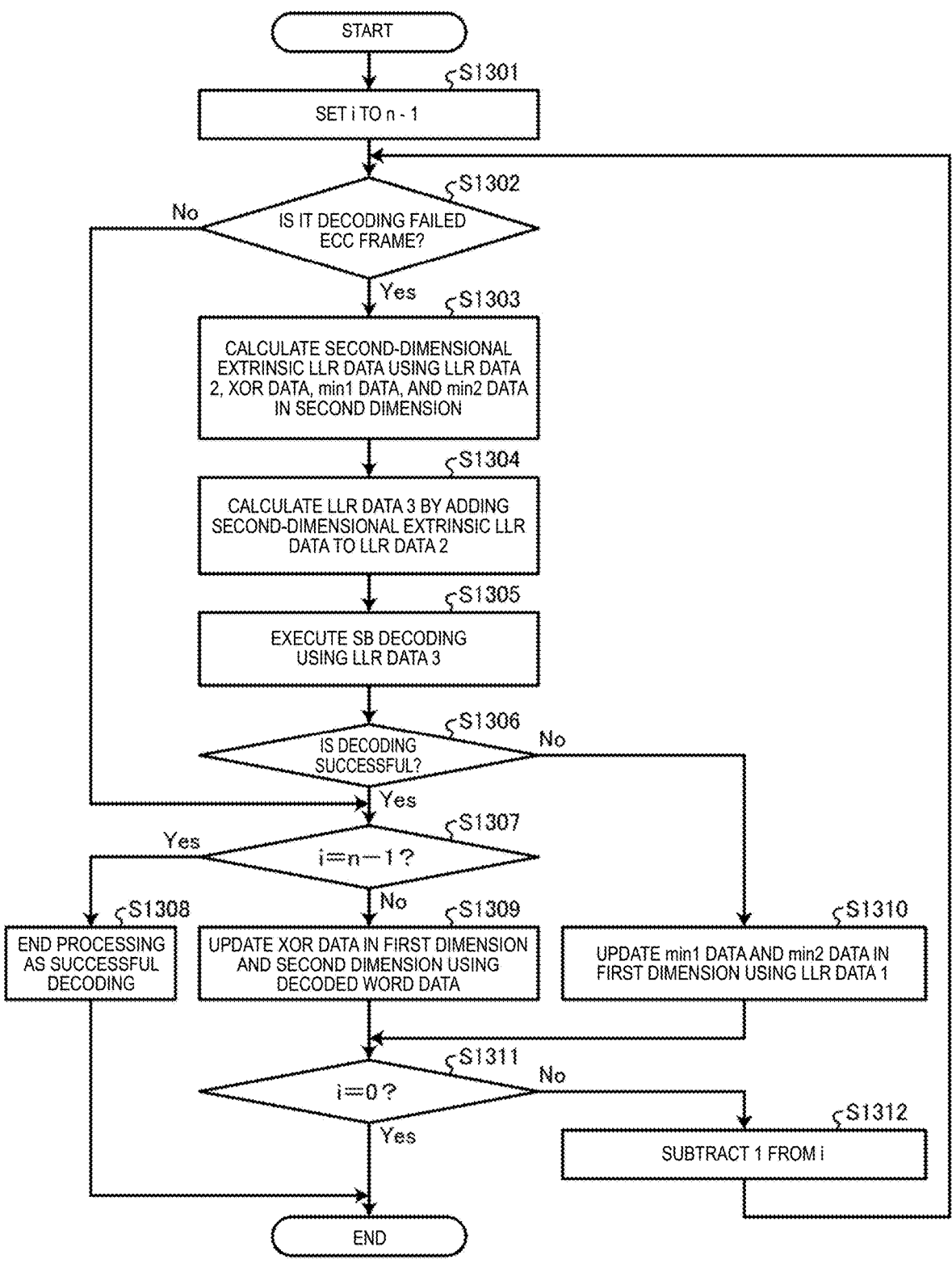
FIG. 30 is a flowchart of decoding processing (other than the first time) for the ECC frame.

Next, the details of the decoding processing (other than the first time) for the ECC frame corresponding to the step S908 to the step S910 in FIG. 26 will be described with reference to FIG. 30. FIG. 30 is a flowchart showing an example of decoding processing (other than the first time) for an ECC frame.

The SISO decoding unit 182 sets i to n−1 (step S1301). The SISO decoding unit 182 determines whether the i-th ECC frame is a decoding failed ECC frame (step S1302).

When the i-th ECC frame is the decoding failed ECC frame (step S1302: Yes), the SISO decoding unit 182 calculates the second-dimensional extrinsic LLR data using the LLR data 2, the second-dimensional XOR data, the second-dimensional min1 data, and the second-dimensional min2 data, according to the following Equation (25) (step S1303).

Equation 25

$$L_{r,i,j}^{(e1)} = c'(-1)^{s'_{r,i,j}} t'_{r,i,j}, \tag{25}$$

$$s'_{r,i,j} = x'_{r,j} \oplus h\left( L_{r,i,j}^{(2)} \right),$$

$$t'_{r,i,j} = \begin{cases} y'_{r,l} \cdots & \text{when } \left| L_{r,i,l}^{(2)} \right| \neq y'_{r,l} \\ z'_{r,l} \cdots & \text{other than} \left| L_{r,i,l}^{(2)} \right| \neq y'_{r,l} \end{cases}$$

The SISO decoding unit 182 calculates LLR data 3 by adding the second-dimensional extrinsic LLR data to the LLR data 2 according to the following Equation (26) (step S1304). i is fixed, and r and j take all combinations in the range of $0 \leq r < K$ and $0 \leq j < m$.

Equation 26

$$L_{r,i,j}^{(3)} = L_{r,i,j}^{(2)} + L_{r,i,j}^{(e2)} \tag{26}$$

The SISO decoding unit 182 executes SB decoding using the LLR data 3 (step S1305). The SISO decoding unit 182 determines whether the decoding is successful (step S105).

When the decoding is successful (step S1306: Yes) and when it is determined in step S1302 that the i-th ECC frame is not the decoding failed ECC frame (step S1302: No), the SISO decoding unit 182 determines whether i=n−1 is established (step S1307). When i=n−1 (step S1307: Yes), the SISO decoding unit 182 ends the processing as successful decoding (step S1308).

When i=n−1 is not satisfied (step S1307: No), the SISO decoding unit 182 updates the first-dimensional XOR data and the second-dimensional XOR data using the decoded word data (step S1309). For example, the SISO decoding unit 182 updates the first-dimensional XOR data $x_{r,j}$ according to the following Equation (27). i is fixed, and r and j take all combinations in the range of $0 \leq r < K$ and $0 \leq j < m$.

Equation 27

$$x_{r,j} = x_{r,j} \oplus D_{r,i,j} \oplus h\left( L_{r,i,j}^{(1)} \right) \tag{27}$$

In addition, the SISO decoding unit 182 updates the second-dimensional XOR data $x'_{r,j}$ according to the following Equation (28). i is fixed, and r and j take all combinations in the range of $0 \leq r < K$ and $0 \leq j < m$. l is a value that satisfies $l \equiv i+j \pmod{2^m-1}$.

Equation 28

$$x'_{r,l} = x'_{r,l} \oplus D_{r,i,j} \oplus h(L^{(2)}_{r,i,j}) \tag{28}$$

When it is determined in step S1306 that the decoding fails (step S1306: No), the SISO decoding unit 182 updates the min1 data and the min2 data in the first dimension using the LLR data 1 (step S1310).

For example, the SISO decoding unit 182 updates the first-dimensional min1 data $y_{r,j}$ and the first-dimensional min2 data $z_{r,j}$ according to the following procedure. i is fixed, and r and j take all combinations in the range of $0 \leq r < K$ and $0 \leq j < m$.

When $|L_{r,i,j}^{(1)}| < y_{r,j}$, first, $z_{r,j}$ is updated with $y_{r,j}$, and then $y_{r,j}$ is updated with $|L_{r,i,j}^{(1)}|$.

When $y_{r,j} \leq |L_{r,i,j}^{(1)}| < z_{r,j}$, $z_{r,j}$ is updated with $|L_{r,i,j}^{(1)}|$.

When $z_{r,j} < |L_{r,i,j}^{(1)}|$, the update is not executed.

After the step S1309 and the step S1310, the SISO decoding unit 182 determines whether i=0 is established (step S1311). When i=0 is not satisfied (step S1311: No), the SISO decoding unit 182 subtracts 1 from i (step S1312), and the process returns to step S1302 to repeat the processing. When i=0 (step S1311: Yes), the SISO decoding unit 182 ends the processing.

As described above, according to the third embodiment, when a decoding method of repeatedly executing SISO decoding by using an RS code and a code different from the RS code is used, the same method as the method of the first embodiment is applied to the decoding of the Hamming code provided in the RS code as an internal structure. Thereby, it is possible to reduce the amount of calculation for decoding the RS code.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:

a non-volatile memory; and a memory controller configured to:

encode data to be written into the non-volatile memory using an error-correction code that includes a Hamming code;

obtain a hard-read value of data read from the non-volatile memory using a read voltage;

obtain a plurality of soft-read values of data read from the non-volatile memory using a plurality of read voltages;

based on the hard-read value and the soft-read values, obtain a soft decision input data, each value of which indicates a likelihood that a corresponding bit of the read data is either 0 or 1;

obtain a hard decision data of the soft decision input data;

obtain a syndrome using the hard decision data and a parity check matrix of the error-correction code;

decoding the hard decision data using a predetermined decoding method to obtain decoded words that are different from each other;

obtain a plurality of metrics each of which indicates a distance between one of the decoded words and the soft decision input data;

generate a metric array using the obtained metrics; and based on a relationship of each value of the metric array with a smallest one of the metrics and a second smallest one of the metrics, obtain a soft decision output data corresponding to the soft decision input data, as a decoding result of the read data.

2. The memory system according to claim 1, wherein the memory controller is configured to:

with respect to each value of the metric array, subtract the smallest one of the metrics therefrom when the value of the metric array is different from the smallest one of the metrics, and subtract the second smallest one of the metrics therefrom when the value of the metric array is the same as the smallest one of the metrics, to obtain first values; and obtain the soft decision output data based on the first values.

3. The memory system according to claim 2, wherein the memory controller is configured to:

multiply a sign of each value of the soft decision input data with a corresponding one of the first values, to obtain second values; and obtain the soft decision output data based on the second values.

4. The memory system according to claim 3, wherein the memory controller is configured to:

with respect to each of the second values, subtract a corresponding one of values of the soft decision input data therefrom, to obtain third values; and obtain the soft decision output data based on the third values.

5. The memory system according to claim 4, wherein the memory controller is configured to multiply a scale coefficient that is greater than 0 and equal to or smaller than 1 to each of the third values, to obtain the soft decision output data.

6. The memory system according to claim 2, wherein the memory controller is configured to:

perform the subtraction when the obtained syndrome is not 0; and multiply a sign of each value of the soft decision input data with a predetermined constant to obtain the soft decision output data, when the obtained syndrome is 0.

7. The memory system according to claim 1, wherein the predetermined decoding method comprises bit flipping of at least one of bits of the hard decision data.

8. The memory system according to claim 1, wherein the predetermined decoding method comprises an Ordered Statistics Decoding (OSD) method.

9. The memory system according to claim 1, wherein the memory controller is configured to:

obtain the metric of a newly-obtained decoded word, and update the metric array, the smallest one of the metrics, and the second smallest one of the metrics, each time the newly-obtained decoded word is obtained.

10. The memory system according to claim 9, wherein the memory controller is configured to:

obtain a modified syndrome from the syndrome; and obtain the metric of a newly-obtained decoded word using the modified syndrome.

11. The memory system according to claim 9, wherein the memory controller is configured to add an absolute value of one of values of the soft decision input data with 2 times an average value of absolute values of the values of the soft decision input data, to update a value of the metric array.

12. The memory system according to claim 9, wherein the memory controller is configured to add an absolute value of one of values of the soft decision input data with a predetermined constant, to update a value of the metric array.

13. The memory system according to claim 9, wherein the memory controller is configured to set a predetermined constant to update a value of the metric array.

14. The memory system according to claim 1, wherein the error-correction code comprises a Reed-Solomon (RS) code that comprises a combination of a single parity check code and the Hamming code.

15. The memory system according to claim 1, wherein the error-correction code comprises a concatenated code of a Reed-Solomon (RS) code and a first code different from the RS code, the RS code comprising a combination of a single parity check code and the Hamming code.

16. The memory system according to claim 1, wherein the metric array is a one-dimensional metric array.

17. The memory system according to claim 1, wherein the memory controller includes:

a first decoder configured to perform a hard-input hard-output (HIHO) decoding with respect to the data read from the non-volatile memory; and a second decoder configured to perform a soft-input soft-output (SISO) decoding with respect to the data read from the non-volatile memory, to obtain the decoding result of the read data.

18. The memory system according to claim 1, wherein the second decoder is configured to perform the SISO decoding when the HIHO decoding of the data read from the non-volatile memory fails.

19. A method of controlling a memory system including a non-volatile memory, the method comprising:

encoding data to be written into the non-volatile memory using an error-correction code that includes a Hamming code;

obtaining a hard-read value from data read from the non-volatile memory using a read voltage;

obtaining a plurality of soft-read values from data read the non-volatile memory using a plurality of read voltages;

based on the hard-read value and the soft-read values, obtaining a soft decision input data, each value of which indicates a likelihood that a corresponding bit of the read data is either 0 or 1;

obtaining a hard decision data of the soft decision input data;

obtaining a syndrome using the hard decision data and a parity check matrix of the error-correction code;

decoding the hard decision data using a predetermined decoding method to obtain decoded words that are different from each other;

obtaining a plurality of metrics each of which indicates a distance between one of the decoded words and the soft decision input data;

generating a metric array using the obtained metrics; and based on a relationship of each value of the metric array with a smallest one of the metrics and a second smallest one of the metrics, obtaining a soft decision output data corresponding to the soft decision input data.

* * * * *